United States Patent
Begley et al.

(10) Patent No.: US 11,476,954 B2
(45) Date of Patent: *Oct. 18, 2022

(54) METHODS AND SYSTEMS FOR WIRELESS POWER SOURCE IDENTIFICATION BY GENERATING ONE OR MORE SERVICE SET IDENTIFIER (SSID) COMMUNICATION SIGNALS

(71) Applicant: 1985736 Ontario Inc., Petersburg (CA)

(72) Inventors: Luke Gordon Begley, Petersburg (CA); Travis Michael Hunter Dunn, Waterloo (CA)

(73) Assignee: CIRCUITIQ INC., Petersburg (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/686,000

(22) Filed: Nov. 15, 2019

(65) Prior Publication Data

US 2020/0112380 A1 Apr. 9, 2020

Related U.S. Application Data

(63) Continuation-in-part of application No. 15/831,314, filed on Dec. 4, 2017, now Pat. No. 10,635,133.
(Continued)

(51) Int. Cl.
*H04B 17/00* (2015.01)
*H04W 84/12* (2009.01)
(Continued)

(52) U.S. Cl.
CPC ..... *H04B 17/0085* (2013.01); *G01R 31/2832* (2013.01); *G06V 20/20* (2022.01); *H02J 13/00* (2013.01); *H04W 84/12* (2013.01)

(58) Field of Classification Search
CPC .......................... H04B 17/0085; H04W 84/12
See application file for complete search history.

(56) References Cited

U.S. PATENT DOCUMENTS

| | | | |
|---|---|---|---|
| 6,422,595 B1* | 7/2002 | Breed | B60N 2/002 280/735 |
| 6,734,914 B1* | 5/2004 | Nishimura | H04N 13/296 348/375 |

(Continued)

OTHER PUBLICATIONS

Written Opinion of the International Search Authority dated Jun. 11, 2018 in PCT/IB2018/050798.
(Continued)

*Primary Examiner* — Rasheed Gidado
(74) *Attorney, Agent, or Firm* — Eugene J. A. Gierczak; Gardiner Roberts LLP

(57) ABSTRACT

A system for testing one or more electric circuits simultaneously includes one or more wireless testing devices connected to one or more electric circuits through wired connection, and a receiver device communicatively coupled to the one or more wireless testing devices through wireless connection. Each wireless testing device includes an input unit for converting a physical electrical input received from corresponding electric circuit, into an electrical signal, a generator unit configured to generate one or more variable service set identifier (SSID) communication signals based on corresponding input electrical signal, and a transmitter unit configured to transmit the one or more SSID communication signals to one or more receiver devices simultaneously. The receiver device is configured to receive and monitor the one or more SSID signals, to troubleshoot, verify, analyze, monitor, control and identify the one or more electrical circuits simultaneously.

34 Claims, 15 Drawing Sheets

Related U.S. Application Data

(60) Provisional application No. 62/449,470, filed on Jan. 23, 2017.

(51) Int. Cl.
    *G01R 31/28*     (2006.01)
    *H02J 13/00*     (2006.01)
    *G06V 20/20*     (2022.01)

(56) References Cited

U.S. PATENT DOCUMENTS

| | | | |
|---|---|---|---|
| 6,760,710 B1* | 7/2004 | Perg | G06Q 20/042 |
| | | | 705/30 |
| 9,137,012 B2* | 9/2015 | Bailey | H04L 9/3228 |
| 9,189,591 B2* | 11/2015 | Segal | G06F 30/398 |
| 9,781,609 B1* | 10/2017 | Kurtz | H04W 24/02 |
| 10,345,891 B2* | 7/2019 | Kanma | H04W 48/16 |
| 10,515,177 B1* | 12/2019 | Ruehl | G06F 30/392 |
| 10,595,269 B2* | 3/2020 | Kish | H04W 48/20 |
| 10,887,189 B2* | 1/2021 | Flores Guerra | H04L 41/22 |
| 2010/0232337 A1* | 9/2010 | Das | H04W 4/12 |
| | | | 370/312 |
| 2013/0152168 A1* | 6/2013 | Nasir | H04W 12/08 |
| | | | 726/4 |
| 2014/0337165 A1* | 11/2014 | Chen | G06Q 30/0631 |
| | | | 705/26.7 |
| 2015/0029540 A1* | 1/2015 | Jo | G06F 3/1236 |
| | | | 358/1.15 |
| 2015/0134115 A1* | 5/2015 | Gong | B25J 9/1656 |
| | | | 700/259 |
| 2016/0073238 A1* | 3/2016 | Okabayashi | H04W 52/0258 |
| | | | 455/456.1 |
| 2016/0088667 A1* | 3/2016 | Tomita | H04W 4/80 |
| | | | 370/338 |

OTHER PUBLICATIONS

Office Action dated Jul. 19, 2019 in U.S. Appl. No. 15/831,314.
Notice of References dated Jul. 19, 2019 in U.S. Appl. No. 15/831,314.

* cited by examiner

METHODS AND SYSTEMS FOR WIRELESS POWER SOURCE IDENTIFICATION BY GENERATING ONE OR MORE SERVICE SET IDENTIFIER (SSID) COMMUNICATION SIGNALS

TECHNICAL FIELD

The present invention relates to troubleshooting, verification, analysis, monitoring, control and identification of electrical circuits. More specifically, it relates to a method of using one or more wireless devices to accurately troubleshoot one or more electrical power source and/or data communication circuit lines using wireless communication signals and more specifically service set identifier (SSID) communication beacons.

BACKGROUND

The major hazards associated with electricity are electrical shock, fire and are flash. Electrical shock occurs when the body becomes part of the electric circuit, either when an individual encounters live wires of an electrical circuit, one wire of an energized circuit and the ground, or a metallic part that has become energized by contact with an electrical conductor. The severity and effects of an electrical shock depend on a number of factors, such as the pathway through the body, the amount of current, the length of time of the exposure, and whether the skin is wet or dry. Water is a great conductor of electricity, allowing current to flow more easily in wet conditions and through wet skin. The effect of the shock may range from a slight tingle to severe burns to cardiac arrest.

Electrical regulations state that the live conductors to which a person may be exposed must be de-energized before the person works on or near them, unless it can be demonstrated that by de-energizing the conductors, hazards may be increased or it is not feasible due to equipment design or operational limitations. Therefore, in order to de-energize a circuit, it is important to identify the correct electrical circuit breaker or fuse. If the circuit as not properly labeled or identified, the user must first troubleshoot the circuit to locate the appropriate breaker, de-energize the same, and then verify that the line is dead.

Several methods exist for identification of power sources for electrical circuits. However, there are several problems associated with those methods. One problem is that the existing devices can test only one electrical circuit at a time. Another problem is that multiple electrical outlets may be on one line connected to the same circuit breaker or fuse, creating confusion for the user. Yet another problem is that the electrical outlet is often not local to the breaker panel or fuse box location. As the size of the distance between the outlets and the breaker panel or fuse box increases, further issues may be created with transmitting and receiving information about the status of the electrical circuit.

Further, a permit is required to install or alter any permanent wiring or device, run additional wiring, put in an electrical outlet or fixture, install a receptacle for a garage opener, or convert from a fuse box to a circuit breaker panel. Currently there is no way to timestamp an electrical panel or electrical system to record the current existing conditions from the last permitted electrical change.

There have been several attempts to solve the problems associated with testing electrical circuits that includes hardline signal transmitters and receivers, audible and visual indicators, lamps, radios. However, none of those offer solutions to the problems associated with testing multiple electrical circuits simultaneously. Further, large sites generally have many systems to which there is an abundant amount of information to consider when investigating.

Around 83 percent of experts believe that the Internet of Things (IoT) will make an impact on the everyday lives of users by 2025. The process of connecting and disconnecting is an inefficient way of communicating. Most devices use service set identifier (SSID) beacon only for advertisement and miss the true value of this type of communication. Beacons are examples of how humans speak with bursts of information. Beacons can and should be used as a form of communication to troubleshoot, verify, analyze, monitor, control and identify electrical circuits.

In addition, modern data centers have complex data wiring schemes. Identifying the data source of a particular data cable is a frequent issue encountered by data technicians. Current methods for data source identification or data communication line tracing suffer from the same problems of current methods for power source identification as in that only one line can be tested at a time. Only testing one circuit at a time is tedious and time consuming.

In view of the above, there is a need for a method and system that overcomes the disadvantages associated with existing systems, and that facilitates troubleshooting, verifying, analysis, monitoring, controlling and identification of multiple electrical circuits simultaneously.

SUMMARY

An embodiment of the present invention discloses one or more wireless testing devices for analyzing one or more electric circuits with the ability to test various electrical parameters by adjusting the input electrical instrumentation, and the receiver device communicatively coupled to the one or more wireless testing devices through wireless communication. Each wireless testing device includes an input unit for converting a physical electrical input received from corresponding electric circuit, into an electrical signal, a generator unit configured to receive the electrical signal and generate one or more variable service set identifier (SSID) communication signals based on corresponding input electrical signal, and a transmitter unit comprising one or more transmitters, wherein the one or more transmitters are configured to transmit the one or more wireless communication signals to one or more receiving devices simultaneously. The receiver device is communicates to the one or more wireless testing devices through wireless communication and configured to receive and monitor the one or more service set identification beacon signals, to troubleshoot, verify, analyze, monitor, control and identify the one or more electrical circuits simultaneously.

Another embodiment of the present invention discloses a method for power source identification of one or more wireless testing devices connected to one or more electric circuits of a breaker panel, wherein the one or more wireless testing devices are configured to generate and transmit the one or more service set identifier (SSID) communication signals to a receiver device simultaneously, based on the input of corresponding electric circuit, and wherein the receiver device is configured to provide a user interface for power source identification of the breaker panel. The method includes plugging one or more wireless testing devices into power receptacle outlets of one or more electrical circuits, turning off each electric circuit one by one, monitoring and recording the wireless testing devices connected to each electric circuit, based on corresponding SSID signals received, after corresponding electric circuit is turned off monitoring which devices lose power, and displaying electrical circuits associated with each wireless testing device on the user interface by building a digital panel card.

Yet another embodiment of the present invention discloses a method for testing one or more electric circuits simultaneously. The method includes connecting one or more wireless testing devices to the one or more electric circuits, converting a physical electrical input received from corresponding electric circuit, into an electrical signal, generating one or more variable service set identifier (SSID) communication signals corresponding to input electrical signal, transmitting communication signals to a receiver device simultaneously, wherein the receiver device is communicatively coupled to the one or more wireless testing devices through wireless connection, and receiving and monitoring the signals by the receiver device to troubleshoot, verify, analyze, monitor, control and identify the one or more electrical circuits simultaneously.

Yet another embodiment of the present invention discloses a method for testing one or more data communication circuits simultaneously. The method includes connecting one or more wireless testing devices to the one or more data communication lines, then connecting a direct current power source to the other end. By removing the portable power sources one by one and receiving and monitoring the signals by the receiver device to troubleshoot, verily, analyze, monitor, control and identify the one or more data communication circuits simultaneously.

The preferred embodiments capture as-built information through image/pattern recognition and apply this to artificial intelligence machine learning software for assisting electrical circuit troubleshooting, analysis, monitoring or identification purposes of power and/or communication lines with augmented, mixed or virtual reality in the real world. Also, when the identification labels are combined with software that has image recognition capabilities, a host of as-built information from the electrical panel has been captured. This also becomes powerful when the artificial intelligence is paired with augmented reality, so that live information can be projected and overlaid on to the real world through the lenses of smart glasses, contacts or devices. Once analyzed, the circuits can be easily be identified through permanent labels or NFC chips linking the various outlets, switches, devices and components to site specific information.

Thus, various embodiments of the present invention provide an end to end seamless electrical power and communication circuit troubleshooting, identification, analyzing, monitoring, and outlet labeling user experience that utilizes artificial intelligence (AI), augmented reality (AR) and Near Field Communication (NFC). The user experience may enable average users to perform electrical troubleshooting tasks at the level of a subject matter expert (SME) combined with an average-user friendly experience. Since multiple wireless testing devices can be used simultaneously, the normally time-consuming task of circuit power source identification may be significantly optimized.

It will be appreciated that features of the present invention are susceptible to being combined in various combinations without departing from the scope of the present invention as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present invention, exemplary constructions of the invention are shown in the drawings. However, the present invention is not limited to specific methods and instrumentalities disclosed herein. Moreover, those in the art will understand that the drawings are not to scale. Wherever possible, like elements have been indicated by identical numbers.

Embodiments of the present invention will now be described, by way of example only, with reference to the following diagrams wherein.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF DRAWINGS

The present invention will now be described more fully with reference to the accompanying drawings, in which embodiments of the present invention are shown. However, this invention should not be construed as limited to the embodiments set forth herein. Rather, these embodiments are provided so that this invention will be thorough and complete, and will fully convey the scope of the present invention to those skilled in the an. Like numbers refer to like elements throughout.

Overview

The primary purpose of the present invention is to solve the problem of testing multiple electrical circuits simultaneously by communicating or establishing communication simultaneously (via service set identifiers) with one or more smart devices without making a connection between the devices. The wireless testing device is configured to send one-way SSID communication signals via Wi-Fi to various smart devices. The wireless testing device is configured to receive one-way SSID communication signals. This is similar to how User Datagram Protocol (UDP) works as opposed to connecting devices that use Transmission Control Protocol (TCP). In the present invention, the transmitted and the received signals are a one-way communication and such two one-way signals are equal to a safe alternative to regular two-way communication. The SSID communication signals act as input information for an application, program or software on the smart devices. As mentioned, the wireless testing device is only a one-way communication device and is a safe alternative to two-way connected devices that usually form a network.

However, for a person skilled in the art, it is understood that the present invention is not limited to this example but, can also be implemented for any kind of wireless testing device as known in the art or developed later.

Exemplary Environment

Figure 1:
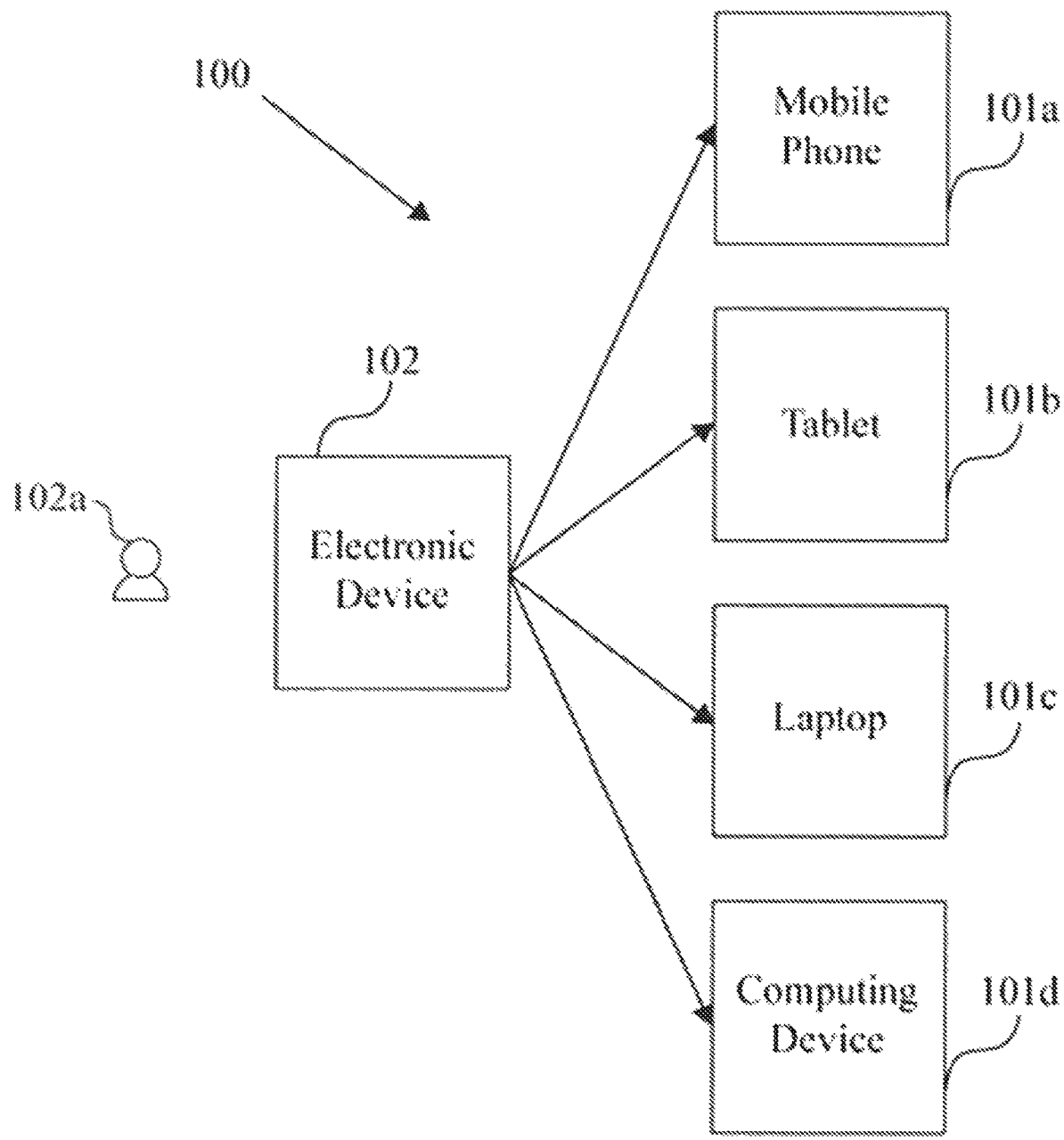
FIG. 1 illustrates an exemplary environment in which various embodiments of the present invention can be practiced.

FIG. 1 is an exemplary environment 100 in which various embodiments of the invention can be practiced. The exemplary environment 100 may represent Internet of Things (IoT) environment, a smart environment, for example, personal, business and recreational environment or the like. Various other examples of the environment 100 include, but are not limited to, augmented reality, gaming, smart home systems, and home appliances.

As shown, the environment 100 includes a user 102a, an electronic device 102, and one or more smart devices 101a (a mobile phone), 101b (a tablet), 101c (a laptop), and 101d (a computing device) (collectively 101). The smart devices 101 can also be referred to as receiver devices. Various wireless networks may also be implemented such as, Bluetooth or other wireless networks that utilize service set identifiers (SSIDs). In one example, the wireless testing device 102 is connected to a computing device 101d via Bluetooth for trusted software updates, direction pointing and live control mode. Generally, the electronic device 102 is used by the user 102a to troubleshoot, verify, analyze, monitor, control and identify electric circuits, around the device 102.

In context of the present invention, the device 102 is configured to use service set identifiers (SSIDs) for communicating with the receiver devices 101. In particular, the device 102 utilizes Wi-Fi SSID beacon format and uses it for communication instead of access point identification purposes. The SSID contains up to 32 alphanumeric characters, which are case sensitive and is configured in the device 102. Alternatively, the SSID name may contain the 32-character plain text command input. The device 102 generates one or more SSID communication signals and transmits the SSID communication signals as generated to the receiver devices 101. The device 102 first authenticates itself to one or more receiver devices 101. Here, the device 102 securely authenticates itself to one or more receiver devices 101 through an exchange of one or more pre-set SSID communication signals in software applications and passkey pairs. The device 102 is configured to convert a received SSID signal in one frequency/protocol and transmit the same signal in a different frequency/protocol referred to as signal translating. The receiver devices 101 are configured to pick up the SSID communication signals. The receiver devices 101 are Wi-Fi enabled and are able to perceive Wi-Fi SSID beacons or communication signals and use their variable SSID names as software inputs. The receiver devices 101 use at least one of the SSID communication signals as an input for various software, application or program. The device 102 is configured to send one-way SSID communication signals via Wi-Fi to the receiver devices 101. Further yet, in an embodiment the SSID communication signals include one or more commands for the receiver devices 101 to perform the desired tasks or functions.

Further yet, in an embodiment of the invention, the SSID communication signals can be used for at least one of, but not limited to, alarming, identifying, controlling, locating, troubleshooting, geo caching, power source identification, service requesting. The SSID communication signals are changeable. For example, via a dual in-line package (DIP) switch (which selects one of several pre-programmed SSIDs). The SSID communication signals may be changeable through a webpage. Further yet, in an embodiment of the present invention, the SSID communication signals may be changeable via USB with connection to a personal computer. Additionally, the SSID communication signals may be changeable over Bluetooth low energy or other IEEE 802.11 or 802.15 family of protocols using a mobile application.

The device 102 can be used in various locations such as, but not limited to homes, business offices, data centers, resorts, theme parks, schools, hospitals, malls, retirement homes, theme parks, gaming centers or the like. The device 101 can be used for various audiences such as, but not limited to, vacationers (for customer service, security, location), kids (for lost kid location, for assistance), the elderly (for help assistance, patient care alert), home owners (for DYI troubleshooting, device control, home monitoring, alarming), patients and students (for assistance), data center operations staff (for alarming, notification), first responders (for locating SOS beacon). The device 101 may be used for indoor or outdoor applications.

Figure 2:
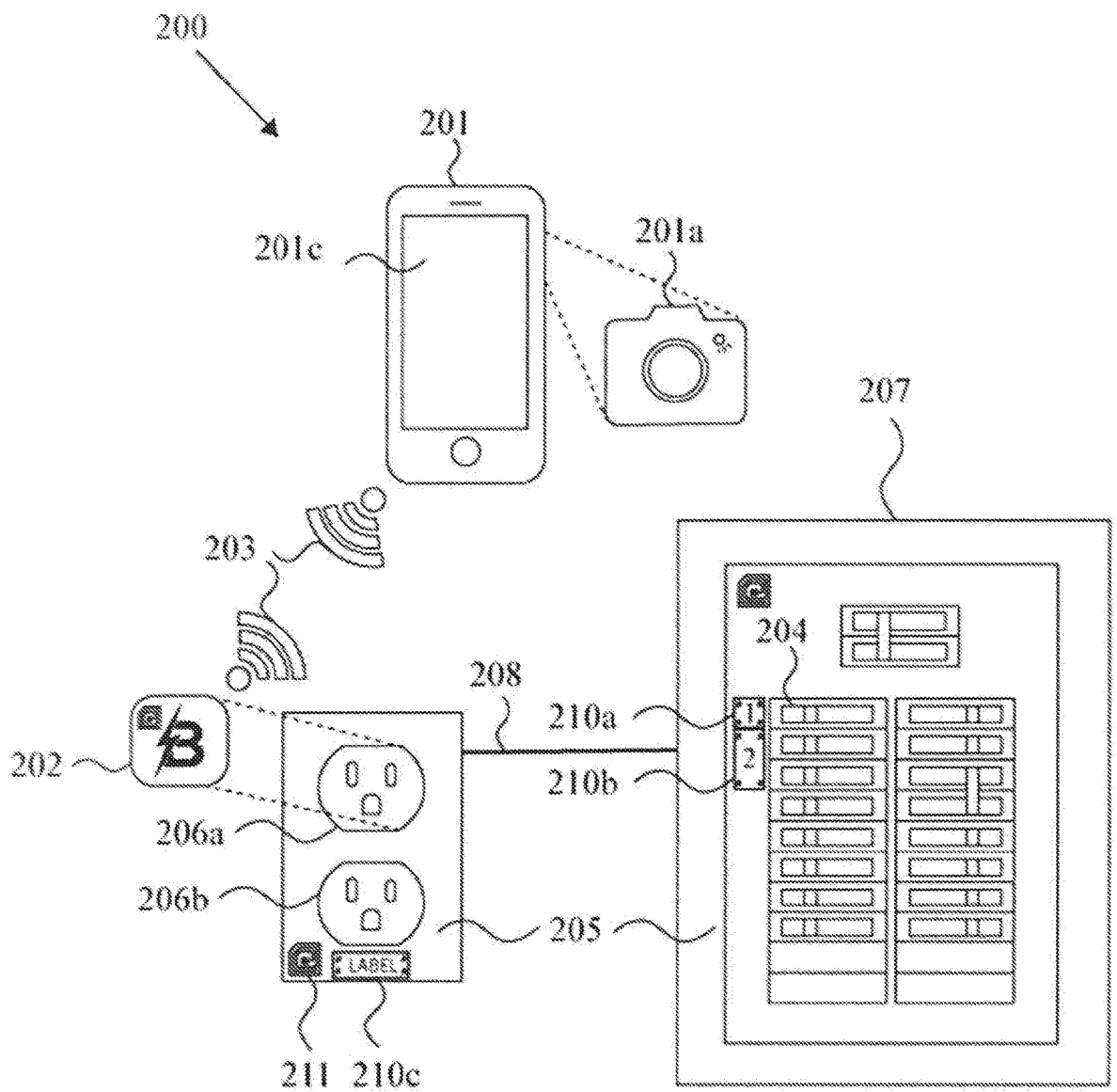
FIG. 2 illustrates a wireless testing device, for performing electrical troubleshooting of an electric circuit such as a breaker switch, in accordance with an embodiment of the present invention.

FIG. 2 illustrates a wireless testing device 202 (which is an example of the electronic device 102), for performing electrical troubleshooting of an electric circuit such as a breaker switch 204, in accordance with an embodiment of the present invention. The electrical testing device 202 is an electronic troubleshooting device configured to support one-way or two-way transmission of the one or more service set identifier wireless communication signals for troubleshooting purposes. When used in a system, one or more electronic troubleshooting devices may be used simultaneously to troubleshoot, identify, analyze, control, identify and monitor multiple electrical circuits at one time.

The wireless testing device 202 is communicatively coupled to a wireless smart device 201 (which is example of the mobile phone 101a) through wireless communication 203 that may include IEEE 802.11 or 802.15 family of protocols communication signals. The wireless smart device 201 includes a high-resolution camera 201a, and a high-resolution display 201c.

The electrical testing device 202 is configured to test the breaker switch 204 that includes a casing cover plate 205, and first and second receptacle power outlets 206a and 206b. The breaker switch 204 is connected to an electric circuit breaker panel 207 which is connected to receptacle power outlets 206a and 206b through a physical power line 208. The electrical circuit breaker panel 207 is the main distribution point for breaker switches in a closed location such as home, or office. It supplies power to the breaker switch 204 based on a rating of corresponding breaker switch. In an embodiment of the present invention, the wireless testing device 202 may be plugged into the first receptacle outlet 206a, and is powered through the physical power line 208.

In an embodiment of the present invention, identification labels 210a and 210b may be placed next to each breaker switch in the electrical circuit breaker panel 207. One such identification label is identification label 210a of the breaker switch 204, where the label 210c is also embedded on the casing cover plate 205 in form of an encoded lamacoid label. In an example, the identification labels 210a, 210b and 210c are colored stickers. Extension lamacoid labels 302 (as illustrated with reference to FIG. 3) may be placed next to double breakers, so that the length of the sticker matches the length of the breaker. The color of the sticker may be chosen according to current rating of corresponding breaker switch in the breaker panel 207. In an embodiment of the present invention, each breaker switch would have a corresponding number, and clear numbered stickers are placed on top of the colored stickers to identify the breaker switch. In another embodiment of the present invention, the identification labels 210a, 210b and 210c may include text that identifies a power source that the first and second receptacle outlets 206a and 206b are powered from.

The identification labels 210a. 210b and 210c may have variable sizes, colors, symbols, characters, shapes, boarders, materials and textures but all of these differences are for the purpose of image recognition via artificial intelligence software.

Figure 3:
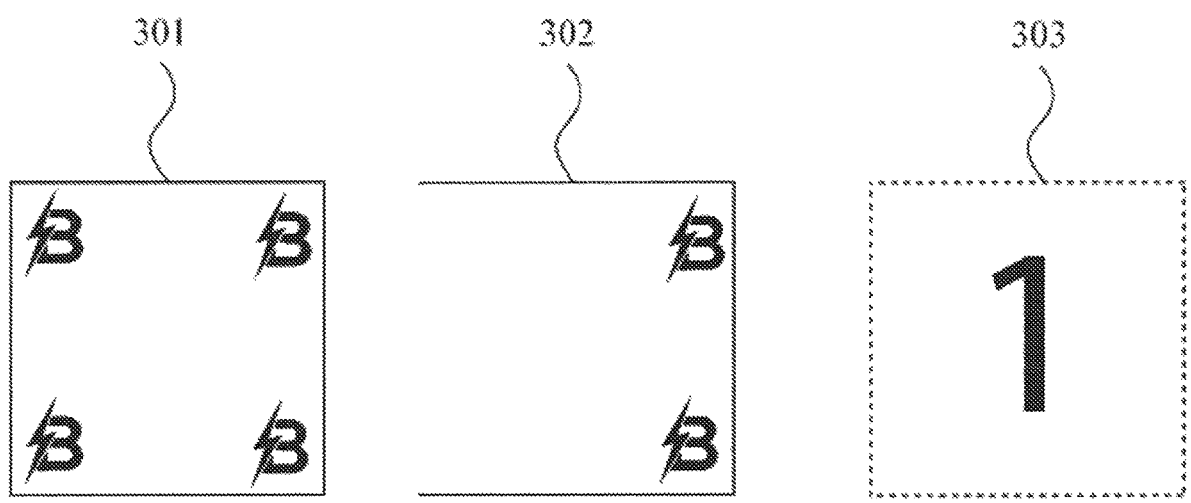
FIG. 3 illustrates first, second and third type of labels used for labelling the breaker switch and the breaker panel, in accordance with an embodiment of the present invention.

Further details about the identification labels have been disclosed with reference to FIG. 3 illustrates first, second and third type of labels 301, 302 and 303 used for labelling the breaker switch 204 and the breaker panel 207, in accordance with an embodiment of the present invention.

The first type of label 301 is a square base lamacoid label 301, and is colored based on a current rating of the breaker switch, for circuit rating image recognition. The first type of label 301 may include text and symbols at all four corners with or without a border, so that an image recognition model may locate and individually identify from the other labels.

The second type of label 302 is referred to as a size extension lamacoid label 302. It is intended to be placed directly beside or below the base lamacoid label 301 as to give the impression of a single rectangular sticker. The size extension lamacoid label 302 includes symbols on two of the corners. The height and width of the size extension lamacoid label 302 is same as that of the base lamacoid label 301, and is used to extend sticker coverage for a breaker with multiple poles which can be identified by the end width or height of modified base lamacoid label 301. The size extension lamacoid label 302 is also colored according to the current rating of the breaker switch it is placed next to and used by the image recognition application to auto input data about the breaker switch. The third type of label 303 is referred to as a clear lamacoid label and is placed on top of the other labels so that each breaker switch can be numbered independent of its color label.

Referring back to FIG. 2, the camera 201a is configured to capture an image of the breaker panel 207 and store in the memory of the smart device 201, so as to receive and store information about identification labels of each breaker swatch in the panel 207. In another embodiment of the present invention, the smart device 201 runs an artificial intelligence (AI) based image recognition application for analyzing the image captured to analyze the properties of one or more electrical panels and/or switchgears for the purpose of electrical troubleshooting. The image recognition application can clearly identify a number of the circuit breaker through character image recognition of the identification labels 210. In an embodiment, the image recognition application includes a first image recognition model for identifying the locations of the corners of each label using the custom insignia found at the corners of each label, a second image recognition model for identifying the number present on each label, and a third image recognition model for identifying the color of each label.

In an embodiment of the present invention, the image recognition application uses the images captured to form a digital panel card. A digital panel card is normally a basic reference to identify the breaker in the electrical panel with the system, device or room it is powering. Panel cards have been generally notorious for being outdated and limited to information based on the size allocated for this information. However, a live digital panel card could connect the user to an unlimited amount of information about the circuit, breaker, panel, system, including maintenance, live readings, fault history, permits, circuit diagrams, and schematics.

In yet another embodiment of the present invention, the smart device 201 runs an augmented reality (AR) software application to display output information. The details regarding the AR software application has been explained in detail with reference to FIG. 10. When utilized with AR, the digital panel card can be over-laid on-top of the real-world image and allows the user to have live real-time information remotely.

Figure 4:
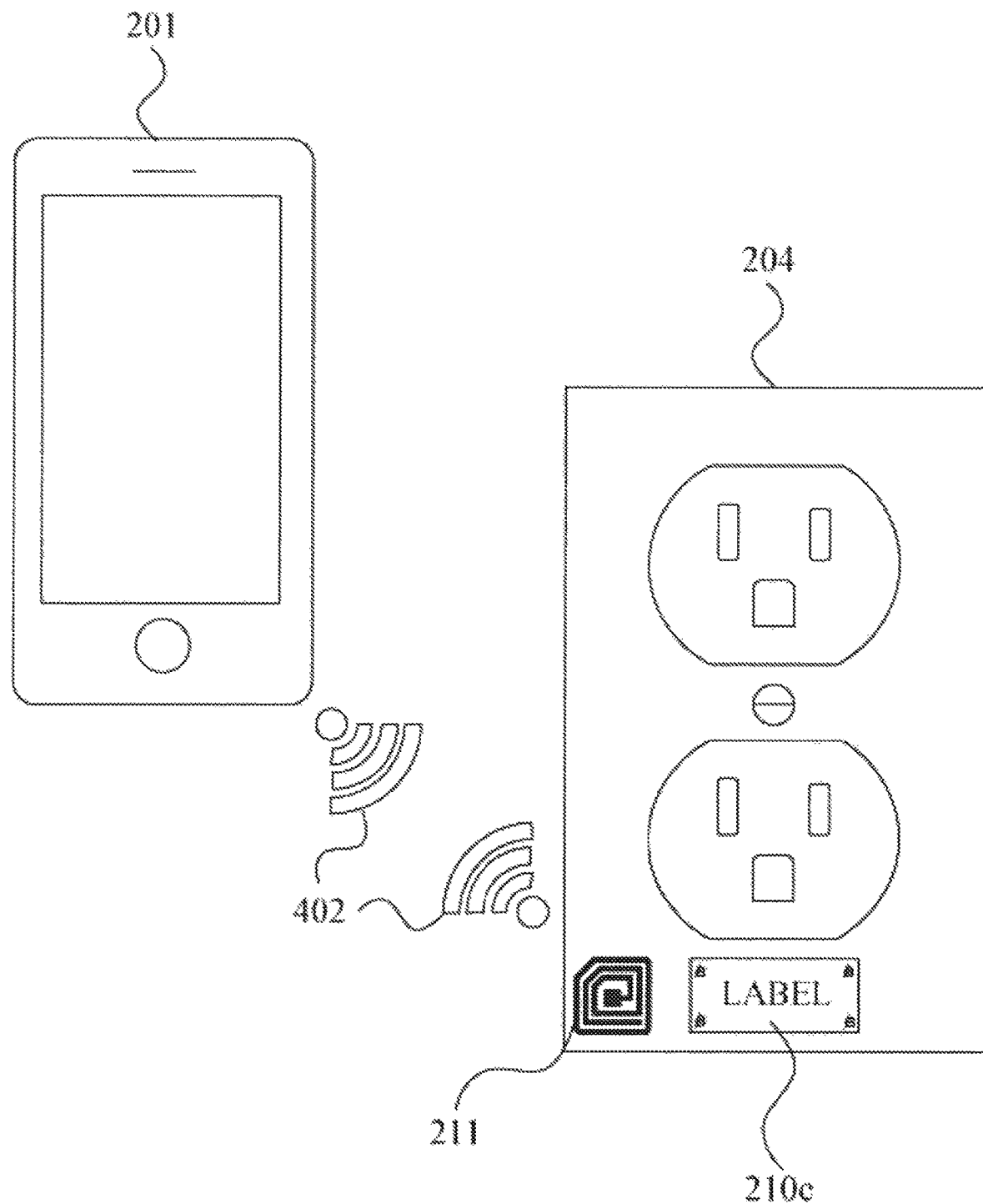
FIG. 4 illustrates near field communication between the wireless testing device and the smart device, in accordance with an embodiment of the present invention.

In addition to the identification label 210c, the casing cover plate 205 may include a near field communication (NFC) chip 211 for communicating with the smart device 201 through near field wireless communication 402 (as illustrated with reference to FIG. 4). The NFC chip 211 is provided on a cover plate of the breaker switch 204, and is used for aesthetics and simplification process for speed and troubleshooting.

Figure 5:
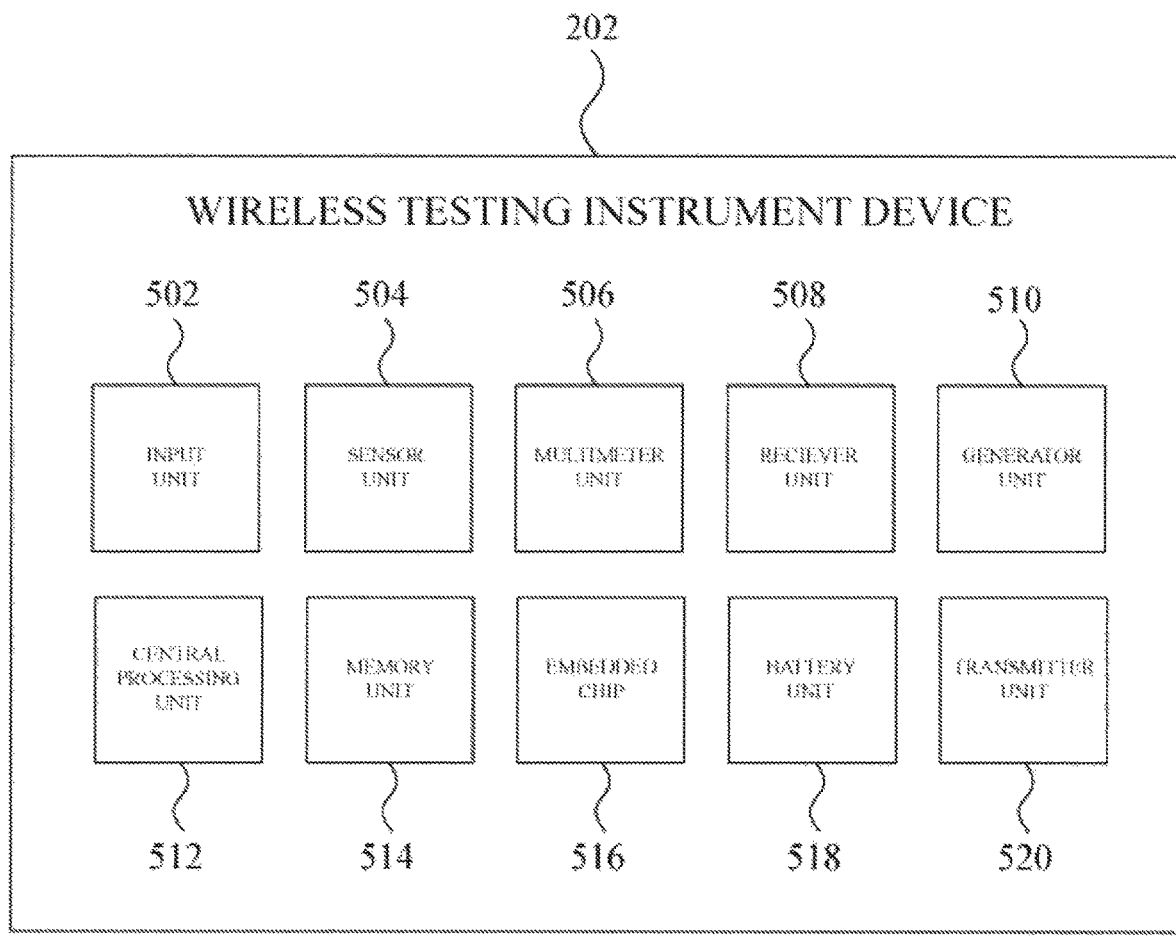
FIG. 5 is a block diagram illustrating the wireless testing device in detail in accordance with an embodiment of the present invention.

FIG. 5 is a block diagram illustrating the wireless testing device 202 in detail, in accordance with an embodiment of the present invention. The wireless testing device 202 leverages service set identifier (SSID) framework and Wi-Fi technology. Thus, any other details related to SSID or Wi-Fi technology are not necessary for discussing the present invention.

Further yet in an embodiment of the present invention, the wireless testing device 202 can be used for at least one of, but not limited to, indoor or outdoor user position tracking, service request notification, SOS, alert, assistance request, travel direction location pointing, messaging, device status, smart Wi-Fi device commands. The wireless testing device 202 can be used as a trackable electronic beacon with pulse ability which can be regulated by a cycle on/off interval setting for indoor/outdoor applications to save power and mitigate radio signal noise and interference of other systems. In an embodiment of the present invention, the wireless testing device 202 allows the user to test multiple circuits wirelessly using their wireless smart device 201 as the receiver.

The wireless testing device 202 supports one-way command communication beacons to receiver devices, supports two-way status, message, or security verification communication beacons (for informational display purposes only, messages alerts and no actual command actions). The wireless testing device 202 includes a circuitry on an embedded board and is simple in its design that allows it to use less power, small in size and cost less. Further, the device 202 may or may not sync and or need regular updates via wireless connection. This setup is only performed during the addition of a new system through hard wire connection to a trusted source.

Further yet, in an embodiment of the invention, the wireless testing device 202 includes an input unit 502, a sensor unit 504, a multimeter unit 506, a receiver unit 508, a generator unit 510, a central processing unit 512, a memory unit 514, an embedded chip 516, a battery unit 518, a transmitter unit 520, and a jack (not shown).

The input unit 502 is generally configured to receive a physical electrical input from circuits, devices, appliances, machinery, users and/or environments.

The sensor unit 504 is generally configured to receive a real-world monitoring input measured with sensors and/or transducers for inputting real-world temperature, humidity, pressure, light, flow, proximity, acceleration, sound, smoke, color, touch, tilt, and level.

The multimeter unit 506 is configured to measure and monitor an electrical input measured with circuit transformers, transducers, and/or electrical testing instrumentation for inputting real-world voltage, resistance, current, inductance or capacitance.

The receiver unit 508 includes a receiving antenna for receiving signals from multiple devices. The signals indicate any notifications, messages, alerts or security verification requests, but do not include the capability of modifying or controlling the device 202. The receiver unit 508 may include a variable range antenna. In an embodiment of the present invention, the receiver unit 508 is configured to receive and translate wireless beacon signals to solve the problem of extended distances. The receiver unit 308 may also receive wireless beacon signals for control purposes. In an embodiment of the present invention, the receiver unit 308 uses the receiver to pick up SSID's and repeat them from one device to the next to extend the network, it acts as a beacon repeater network more than a mesh network.

The generator unit 510 is a Wi-Fi SSID generator circuit or may include an embedded Wi-Fi SSID generator board and may be powered by the battery unit 518, either by AC or DC power source. The generator unit 510 has a variable signal range and generates one or more SSID communication signals, where the signals of output range can be adjusted. The generator unit 510 is configured to variably update the service set identifier (SSID) network name with electrical information. The generator unit 510 is configured to generate one or more service set identifier (SSID) communication signals that are either present or are generated from a variable input from various sensors and instrumentation. The SSID communication signals are broadcasted to one or more receiver devices, thus, the wireless testing device 202 is able to communicate with all of the receiver devices without establishing a connection with each of the receiver devices. The SSID communication signals include one or more commands which are received by the receiver devices. The one or more receiver devices use at least one of, SSID communication signals in multiple software applications.

Further yet, in an embodiment of the invention, multiple receiver devices can perceive the wireless testing device 202 and through TAG filtering, the receiver devices can receive commands with a unique user TAG and MAC address confirmation control. In yet another embodiment of the invention, at least one service set identifier communication signals are customizable by a [TAG] section in the 32-character SSID name for filtering purposes. For example, multiple service set identifier communication signals may be customizable by broadcast range. In further example, multiple service set identifier communication signals may be customizable by channel or by one or more Frequency Bands consisting of 900 MHZ, 2.4 GHZ, or 5 GHZ with the ability to Channel Hop through non-overlapping channels. The service set identifier communication signals may be customized using at least one of a touch pad or a cord connection to a personal device of the user such as, a smart phone/computer.

The central processing unit 512 contains the circuitry necessary to align the information of the input unit 502 with the proper SSID output. The central processing unit 512 further determines manual input and creates the SSID output. The central processing unit 512 converts the signal sent to the input unit into an electronic signal which is then used by the generator unit 510 to generate a service set identifier beacon which is variably adjusted via Service Set Identifier (SSID) based on the input signal received.

The memory unit 514 is configured to store one or more of the following: a unique Media access Control (MAC) address, indoor or global positioning systems (IPS or GPS) location coordinates of the electronic device, electrical information about the circuit it is plugged into, SSIDs received for the purpose of repealing. The memory unit 514 may also store data relevant to the context of the SSID communication signals such as commands, SSIDs, or token and passwords combinations used for security verification of commands as well as, store display graphics, software and firmware. The message authentication code (MAC), sometimes known as a tag, is a short piece of information used to authenticate a message—in other words, to confirm that the message came from the stated sender (its authenticity) and has not been changed. The MAC value protects both a message's data integrity as well as its authenticity, by allowing verifiers (who also possess the secret key) to detect any changes to the message content.

The embedded chip 516 may be a NFC, RFID, or HID chip that carries information related to the wireless testing device 202. The embedded chip 516 carries the unique MAC address of the device 202 for the receiver devices to tap for easy setup, or identification for security access.

As a substitution for the embedded chip 516, it could be acceptable to utilize a QR code Sticker. QR codes can be printed onto clear stickers using infrared ink yielding an invisible QR code sticker. These stickers can be useful for labeling electrical outlets, devices or panel with encoded data in a way that minimally interferes with the item's visual appeal.

The battery unit 518 includes a power source which, can be either DC or AC. The power source may be configured to operate device using stored DC power sourced though the jack. The battery unit 518 can be utilized to trace data lines as data lines do not provide sufficient power to operate the beacon. The power source and the signal range output may be variable. In some embodiments, the present invention may use solar circuit. The jack may be at least one of, universal serial bus styles (standard, mini, mini-b, micro, type-c USB), modular connector (RJ11, RJ45) or ribbon connector or an auxiliary jack used for power or communication as well as for hardware updates and set up programming. For example, the updates and programming are performed via direct hardwire connection to a computer or smart device of the user via the jack to a universal serial bus (Out) to a programming device.

The transmitter unit 520 is a wireless transmitter configured to transmit wireless signals based on the IEEE 802.11 or 802.15 family of protocols and associated frequencies simultaneously. The transmitter unit 520 includes one or more transmitters that are configured to transmit one or more service set identifier (SSID) communication signals from the generator unit 510 to one or more receiver devices simultaneously. The transmitted signals can be used by any wireless receiver device that is able to use the received signals for a purpose other than the regular use of identifying a network. Though the receiver devices and systems may most likely be wireless network devices they could also be devices, appliances, and machinery designed specifically to receive wireless SSID signals for the purposes of troubleshooting, verification, analysis, monitoring, control and identification of electrical circuits In an embodiment of the present invention, when the wireless testing device 202 is plugged into an electrical AC receptacle power outlet 206, the corresponding voltage may be measured by the multimeter unit 506 and sent to the input unit 502. When power to the AC receptacle power outlet 206a is off and even if the power was "ON" or "Off", transmission of the generated SSID signals is ceased. The signals are useful when troubleshooting an electrical breaker panel as multiple devices may be used at one time to troubleshoot circuits. The signals relay the on/off capability information of the circuits to allow a worker to quickly label the electrical panel 207.

The transmitter unit 520 may include a transmitting antenna outputting variable SSID name on variable frequency bands with variable range. Further yet, the transmitter unit 520 may be a Wi-fi transmitter. The transmitter unit 520 communicates through one or more Radio Frequency Communications via Wi-Fi SSID signals or beacons following the 802.11 (B/G/N/AC/AH) protocols and associated frequencies (900 mhz, 2.4 ghz, 5 ghz) simultaneously.

Further yet, in an embodiment of the invention, a single transmitter such as transmitter 520 is shown in FIG. 5. However, it is understood that the present invention is equally applicable for one or more transmitters. In the present invention, each transmitter is capable of sending SSID communication signals, simultaneously. For example, a transmitter may send a SSID communication signal to a receiver device "A" while, simultaneously, a transmitter "B" may send SSID communication signals to receiver devices "C, and "D".

Figure 6:
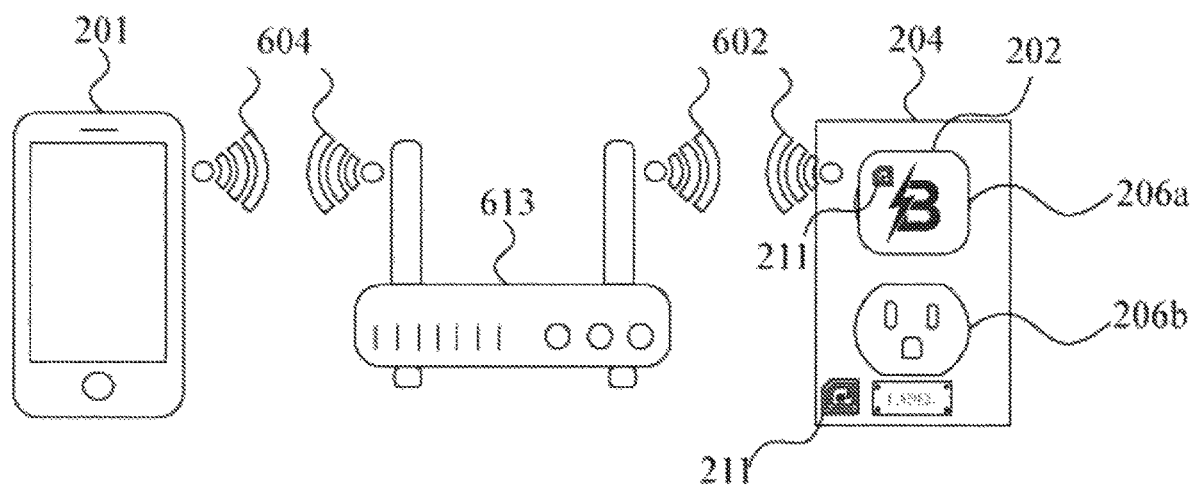
FIG. 6 illustrates wireless testing between the smart device and the wireless testing device through a wireless gateway, in accordance with an embodiment of the present invention.

FIG. 6 illustrates wireless communication between the smart device 201 and the wireless testing device 202 through a wireless gateway 613. The smart device 201 wirelessly communicates with the gateway device 613 and the gateway device 613 communicates wirelessly with the wireless testing device 202 plugged into the first receptacle outlet 206a. The wireless gateway device 613 is used to translate one frequency/protocol SSID beacon 602 to a different frequency/protocol SSID beacon 604 with this unit, or possibly beacon to Bluetooth. In an example, if the smart device 201 can receive beacons of frequencies 2.4 ghz or 5 ghz, and the signal frequency of the wireless testing device 202 is 900 mhz, then the gateway device 613 may be used to receive and translate this information.

Figure 7:
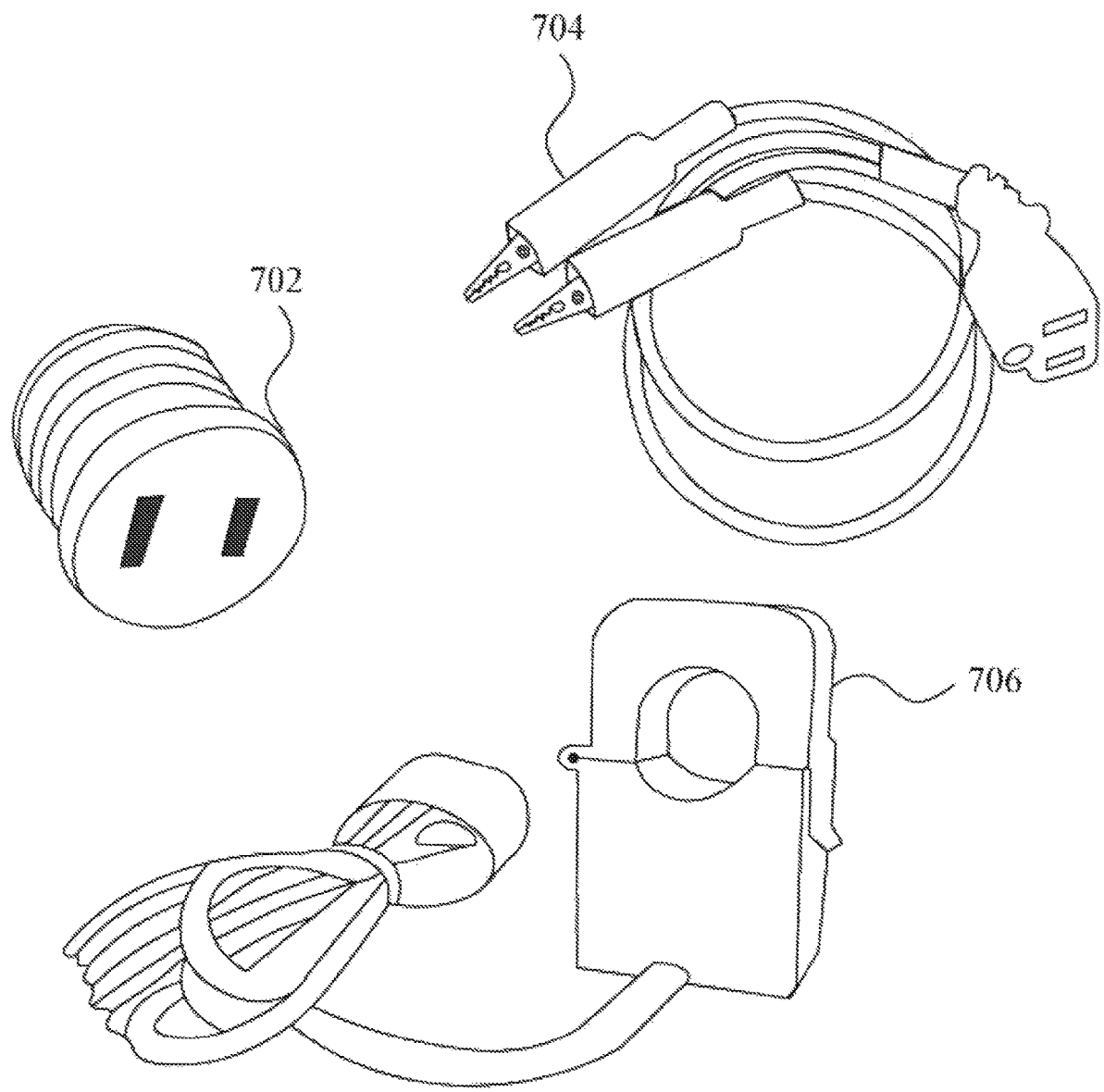
FIG. 7 illustrates some examples of how the wireless testing device can be connected to circuits through different types of connectors, in accordance with an embodiment of the present invention.

FIG. 7 illustrates some examples of how the wireless testing device 202 can be connected to circuits through different types of connectors. One such type of connector is the socket adapter 702 that can be used to connect the wireless testing device 202 to a light socket that is controlled by a switch or dimmer. Another type of connector is the alligator clip adapter 704 that can be used to connect the wireless testing device 202 directly to an unterminated set of wires. Yet another type of connector is the current transformer 706 that can be clamped over a wire to monitor current flow.

Figure 8A:
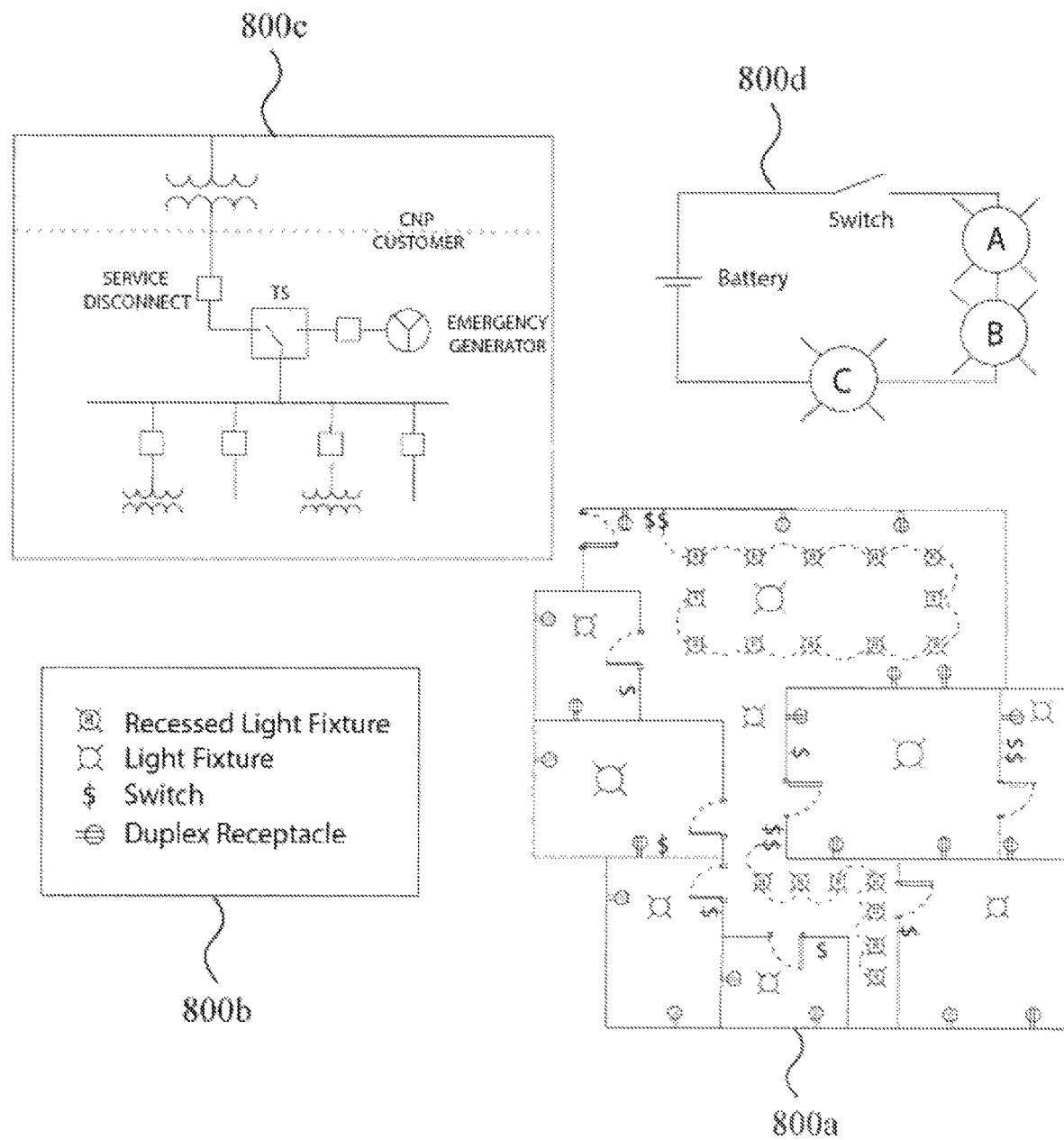
FIG. 8A illustrates an exemplary electrical floor plan of a building layout, standard electrical devices identification symbols, electrical one-line diagrams and electrical schematics, in accordance with an embodiment of the present invention.

FIG. 8A illustrates an exemplary electrical floor plan 800a of a building layout, standard electronic symbols 800b, electrical one-line diagrams 800c and electrical schematics 800d, each used for identifying real-world items on paper. The electrical floor plan 800a is a type of technical drawing that shows information about power, lighting, and communication for an engineering or architectural project. The electrical floor plan 800a includes the layouts of rooms, and convey information about power, lighting, layout and communication. The electrical floor plan 800a shows the location of electrical systems on every floor. The electrical one-line diagram 800c exclusively provides electrical information in simplified notation.

The electrical schematics 800d includes electrical elements such as utility feeds, transformers, switchgear, disconnects, circuit breakers, fuses, capacitors, bus bars, and conductors to secondary panels or boards denoted using standardized schematic electronic symbols. A schematic is defined as a picture that shows something in a simple way, using electronic symbols. A schematic diagram is a picture that represents the components of a process, device, or other object using abstract, often standardized symbols and lines. Schematic diagrams only depict the significant components of a system, though some details in the diagram may also be exaggerated or introduced to facilitate the understanding of the system.

Figure 8B:
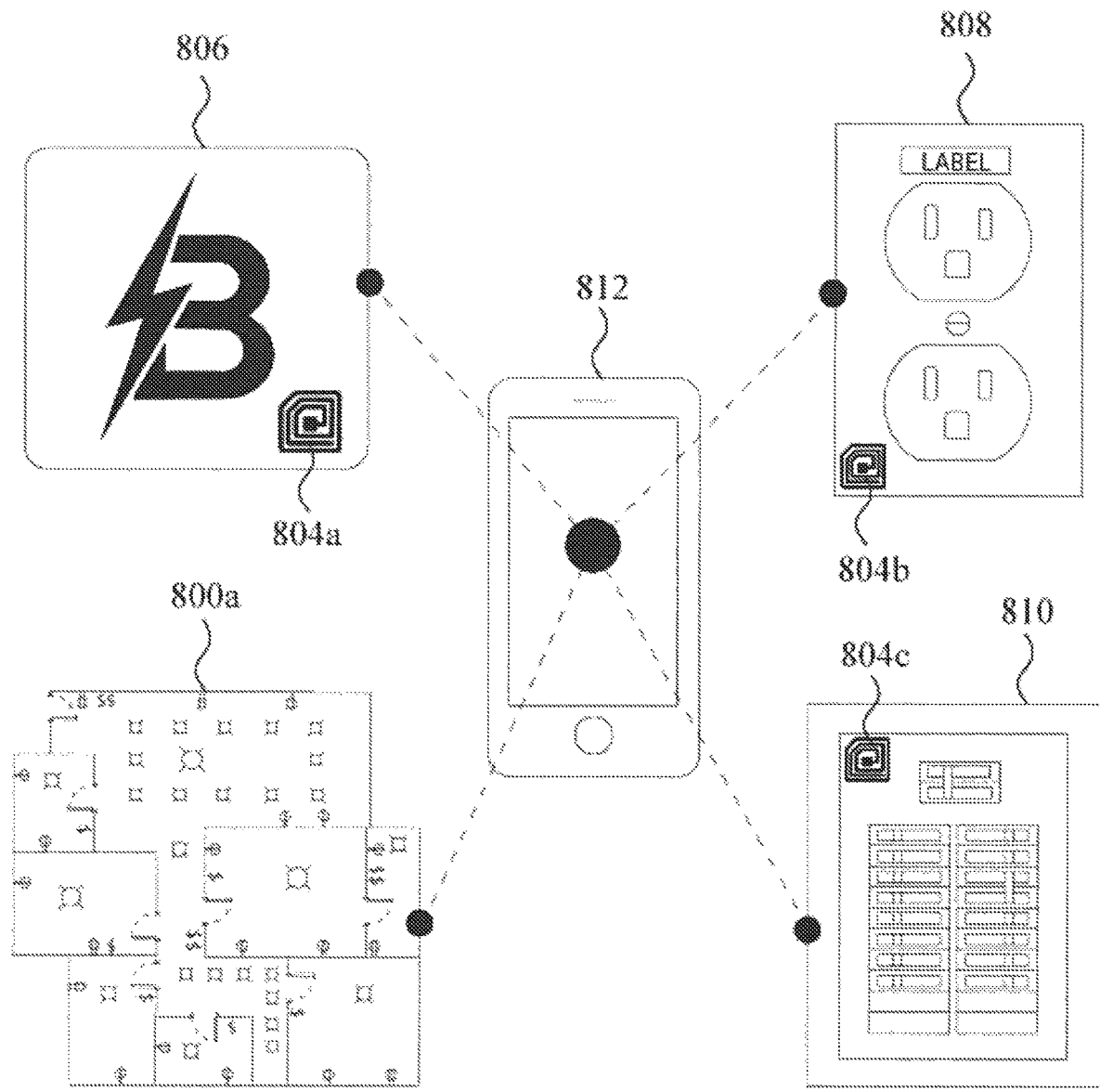
FIG. 8B illustrates a set-up for electrical floor plan linked NFC identification, in accordance with an embodiment of the present invention.

FIG. 8B illustrates a set-up 802 for electrical floor plan linked NFC identification, in accordance with an embodiment of the present invention. A first NFC chip tag 804a is attached to a wireless testing device 806, a second NFC chip tag 804b may be embedded into a casing cover plate 812 of one or more pieces of electrical equipment such as receptacle outlets, lamp sockets, switches, switchgear, disconnects, circuit breakers, fuses, transformers, splitters, phone jacks, Ethernet jacks, and coaxial jacks.

A third NFC chip tag 804c is attached to an electrical breaker panel 810. In an embodiment of the present invention, a smart device 812 runs an application that stores an electric floor plan 800a by storing software copies of raw data of the technical drawings of the electric floor plan 800a. If soft copies are not readily available, a camera of the wireless smart device 812 may capture an image of the electric floor plan 800a, and parse the electric floor plan 800a using image recognition and pattern recognition methods into a format that can be used by a smart phone application.

Further, each of the first, second and third NFC chip tags 804a, 804b and 804c may be linked to the electrical floorplan 800a. The user may walk up to an electric outlet such as the breaker switch 808, and opens the application on their smart device 812 that displays the electrical floor plan 800*a*. The user may then manually search the electric outlet on the floor plan 800*a* and lap on the searched outlet to attach the smart device 812 to the breaker switch 808.

In an embodiment of the present invention, the electrical floor plan linked NFC identification facilitates electrical troubleshooting of electrical equipment. The electrical troubleshooting may be performed by opening the application of the smart device 812 and tapping the device 812 on the equipment's near field communication chip. The device 812 may recognize the identity of the electric equipment, and display electrical information relevant to that equipment, such as electrical floor plans 800*a*, electrical schematics, electrical one-line diagrams, and/or encoded lamacoid labels. Other information may be provided as well such as equipment documentation, including user guides, while papers, method of procedure (MOP), standard operating procedures (SOP), emergency operating procedures (EOP), inventory spare part lists, original equipment manufacturer (OEM) manual, or an operations & maintenance (O&M) manual and/or panel card. Thus, the software application executing on the smart device 812 becomes the electrical expert reference and guide.

In an embodiment of the present invention, the wireless testing device 806 facilitates testing of the electric circuits associated with the electric floor plan 800*a*, and thus verify the electric floor plan 800*a*.

Figure 9:
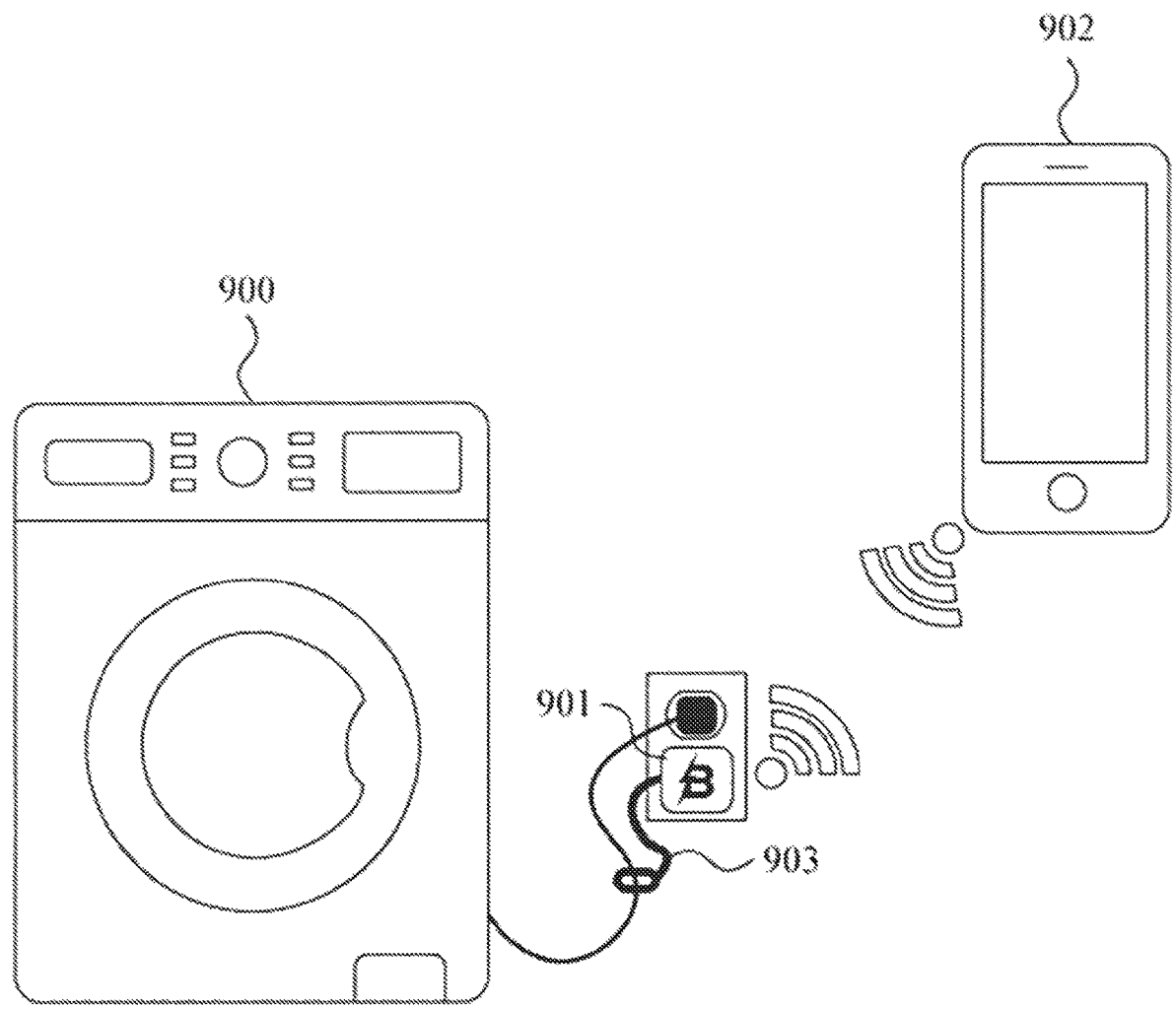
FIG. 9 illustrates monitoring the current of an electrical appliance such as a washing machine, using a wireless testing device and a smart device, in accordance with an embodiment of the present invention.

FIG. 9 illustrates monitoring the current of an electrical appliance 900 such as a washing machine, using a wireless testing device 901 and a smart device 902, in accordance with an embodiment of the present invention. In an embodiment of the present invention, the wireless testing device 901 is configured to monitor a current of the electrical appliance 900 via a current transformer adaptor 903 connected to a multimeter unit and provide real-time update to a receiving smart device 902 when the appliance 900 had finished a wash cycle. In another embodiment of the present invention, the smart device 902 may run an AI based application to predict future wash cycle times based on current monitoring. Examples of the electrical appliance 900 include, but are not limited to, electronic devices, building systems, pumps or motors. In an embodiment of the present invention, a sensor unit may be used for monitoring the humidity of the dryer vent and generate an alert signal when the clothes become dry. In an embodiment of the present invention, a sensor unit may be used for monitoring the suction of a pump and generate an alert signal when the pump loses prime.

Figure 10:
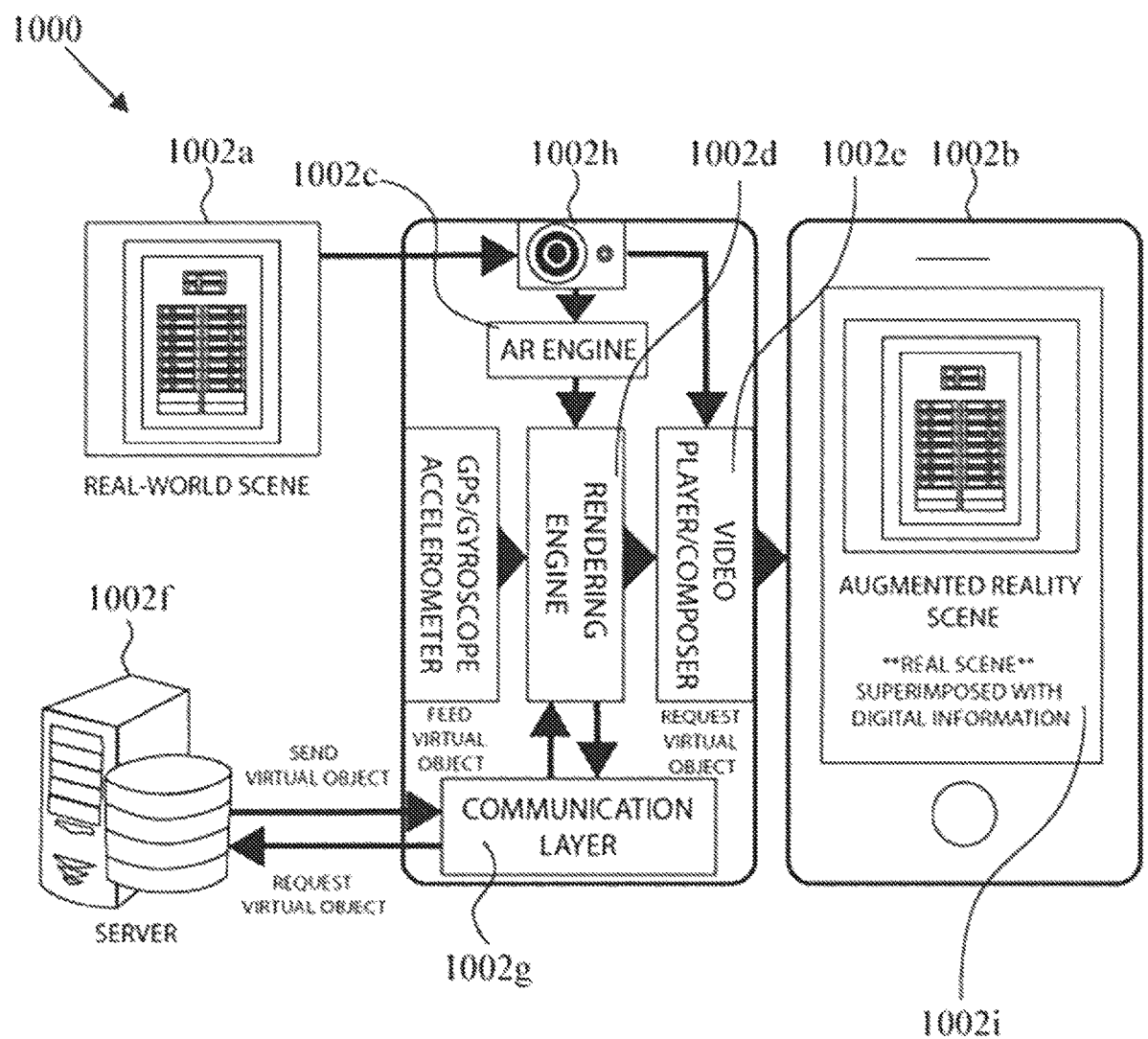
FIG. 10 illustrates an exemplary system superimposing a real-world scene with digital information, in accordance with an embodiment of the present invention.

FIG. 10 illustrates an exemplary system 1000 superimposing a real-world scene 1002*a* with digital information, in accordance with an embodiment of the present invention. The system 1000 includes a smart device 1002*b* that includes an AR engine 1002*c*, a rendering engine 1002*d*, and a video player 1002*e* in communication with the AR engine 1002*c*. The rendering engine 1002*d* is further in communication with a server 1002*f* through a communication layer 1002*g*. Examples of the smart device 1002*b* include, but are not limited to a smart phone, a tablet, a pair of glasses, or contacts to allow the image 1002*a* to come alive.

Augmented Reality (AR) is about enhancing experience in the real world using digital information. An example would be turning a static image input 1002*a* of an electrical breaker panel when viewed with the naked eye to viewing the same image through a display of the smart device 1002*b*.

In operation, information from a camera 1002*h* of the smart device 1002*b* is sent to be analyzed by the AR engine 1002*c*. The AR engine 1002*c* looks for identifiable features such as encoded lamacoid labels. Once the AR engine 1002*c* has verified, that the camera 1002*b* is pointing at the image 1002*a* of the electrical breaker panel, it can overlay graphics 1002*i* on top of the image on the display.

Thus, the AR can be utilized to navigate and troubleshoot the electrical panel of the image 1002*a* with a live digital panel card. A panel card is normally a basic reference to identify the breaker in the electrical panel with the system, device or mom it is powering. When utilized with AR, this information can be over-laid on-top of the real-world image 1002*a* and allows the user to have live real-time information remotely. A live digital panel card could connect the user to an unlimited amount of information about the circuit, breaker, panel, system, including maintenance, live readings, fault history, permits, circuit diagrams, and schematics.

Figure 11:
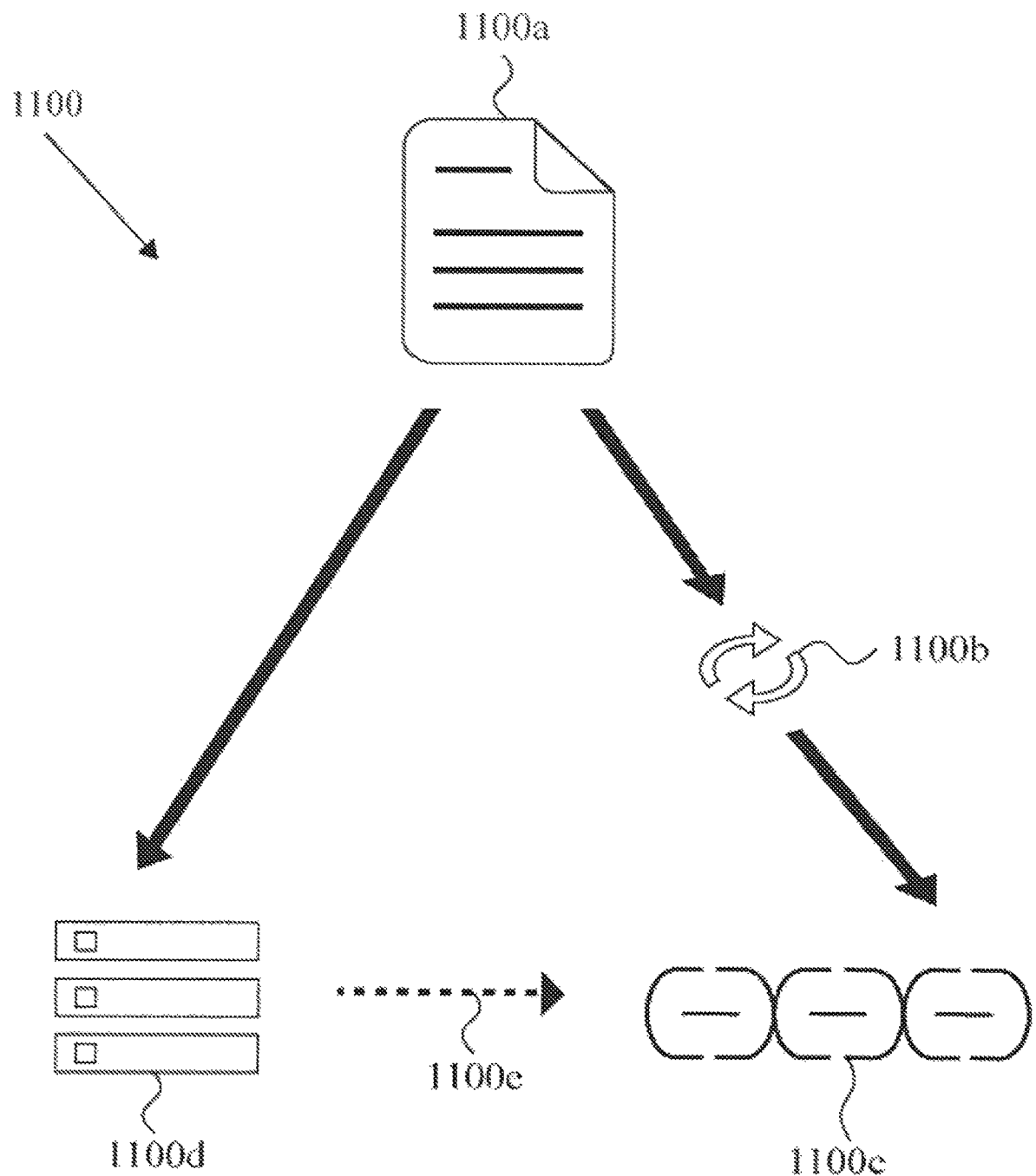
FIG. 11 illustrates an exemplary system for trusted timestamping electrical existing condition as-built data, in accordance with an embodiment of the present invention.

FIG. 11 illustrates an exemplary system 1100 for trusted timestamping electrical existing condition as-built data. A hash 1100*b* string is generated inputting the record data 1100*a*. The hash 1100*b* of the record data 1100*a* is stored on the blockchain 1100*c*. The raw record data 1100*a* is saved and backed up on cloud storage 1100*d* with the unique transaction ID (TX-ID) 1100*c* to link the raw data 1100*a* with the blockchain 1100*c* record for future verification of the trusted timestamp. Blockchain technology is made up of extremely secure, shared blocks of transaction data called distributed ledgers which are distributed among thousands of computers in an agreed state of authenticity. These ledgers contain records that are unchanging and unchangeable over time and are used for any transaction or to hack any asset Blockchain technology is said to possess the abilities to revolutionize Internet technology. It facilitates the transmitting of transactions in a safe and unchangeable environment.

A hash is a generated string, that is computed using the record data as the input. With the same input, the output hash will always be the same. One way of getting the benefits of a blockchain while not paying a fortune for transactions is only storing the hash of the data in the blockchain. It can be told by just looking at the hash if the data was modified. The only thing that is stored on the blockchain is the hash of data. In comparison to data, the hash is very small, so the cost of a transaction is relatively low. The raw data can be stored in any way we want. For example, a relational database or just a file system could be used. All that's needed to be done is to make sure that the id (hash) of the blockchain transaction is assigned to the raw data. In a relational database, another column has to be added to store the transaction id. That way, the advantages of traditional storage mechanisms (like queries) can be utilized while still getting the tamper-evidence of the blockchain. Any time, there is doubt about the data, the raw data can be hashed, and compared to the hash in the assigned transaction in the blockchain.

Transaction ID or TX ID is defined as a string of letters and numbers used to identify a transaction between two parties on a blockchain network. Every transaction has a unique ID. Block Timestamping blocks each contain a Unix lime timestamp. In addition to serving as a source of variation for the block hash, they also make it more difficult for an adversary to manipulate the block chain. A block timestamp is accepted as valid if it is greater than the median timestamp of previous eleven blocks, and less than the network-adjusted time by two or more hours. "Network-adjusted time" is the median of the timestamps returned by all nodes connected to you. Whenever a node connects to another node, it gets a UTC timestamp from it, and stores its offset from node-local UTC. The network-adjusted time is then the node-local UTC plus the median offset from all connected nodes. A blockchain, originally block chain, is a growing list of records, called blocks, that are linked using cryptography. Each block contains a cryptographic hash of the previous block, a timestamp, and transaction data. By design, a blockchain is resistant to modification of the data.

Trusted timestamping is the process of securely keeping track of the creation and modification time of a document. Security here means that no one—not even the owner of the document—can alter the data. A timestamp is a sequence of characters or encoded information identifying when a certain event occurred, usually giving date and time of day, sometimes accurate to a small fraction of a second.

The ANSI X9.95 standard for trusted timestamps expands on the widely used RFC 3161-Internet X.509 Public Key Infrastructure Time-Stamp Protocol by adding data-level security requirements that can ensure data integrity against a reliable time source that is provable to any third party. Applicable to both unsigned and digitally signed data, this newer standard has been used by financial institutions and regulatory bodies to create trustworthy timestamps that cannot be altered without detection and to sustain an evidentially trail of authenticity, ISO/IBC 18014.

Transient-key cryptography is a form of public-key cryptography wherein keypairs are generated and assigned to brief intervals of time instead of to individuals or organizations, and the blocks of cryptographic data are chained through time. In a transient-key system, private keys are used briefly and then destroyed, which is why it is sometimes nicknamed "disposable crypto." Data encrypted with a private key associated with a specific time interval can be irrefutably linked to that interval, making transient-key cryptography particularly useful for digital trusted timestamping.

Linked timestamping creates time-stamp tokens which are dependent on each other, entangled in some authenticated data structure. Later modification of the issued timestamps would invalidate this structure. The temporal order of issued timestamps is also protected by this data structure, making backdating of the issued time-stamps impossible, even by the issuing server itself.

A public key infrastructure (PKI) is a set of roles, policies, hardware, software and procedures needed to create, manage, distribute, use, store and revoke digital certificates and manage public-key encryption. The purpose of a PKI is to facilitate the secure electronic transfer of information for a range of network activities such as e-commerce, internet banking and confidential email. It is required for activities where simple passwords are an inadequate authentication method and more rigorous proof is required to confirm the identity of the parties involved in the communication and to validate the information being transferred.

Figure 12:
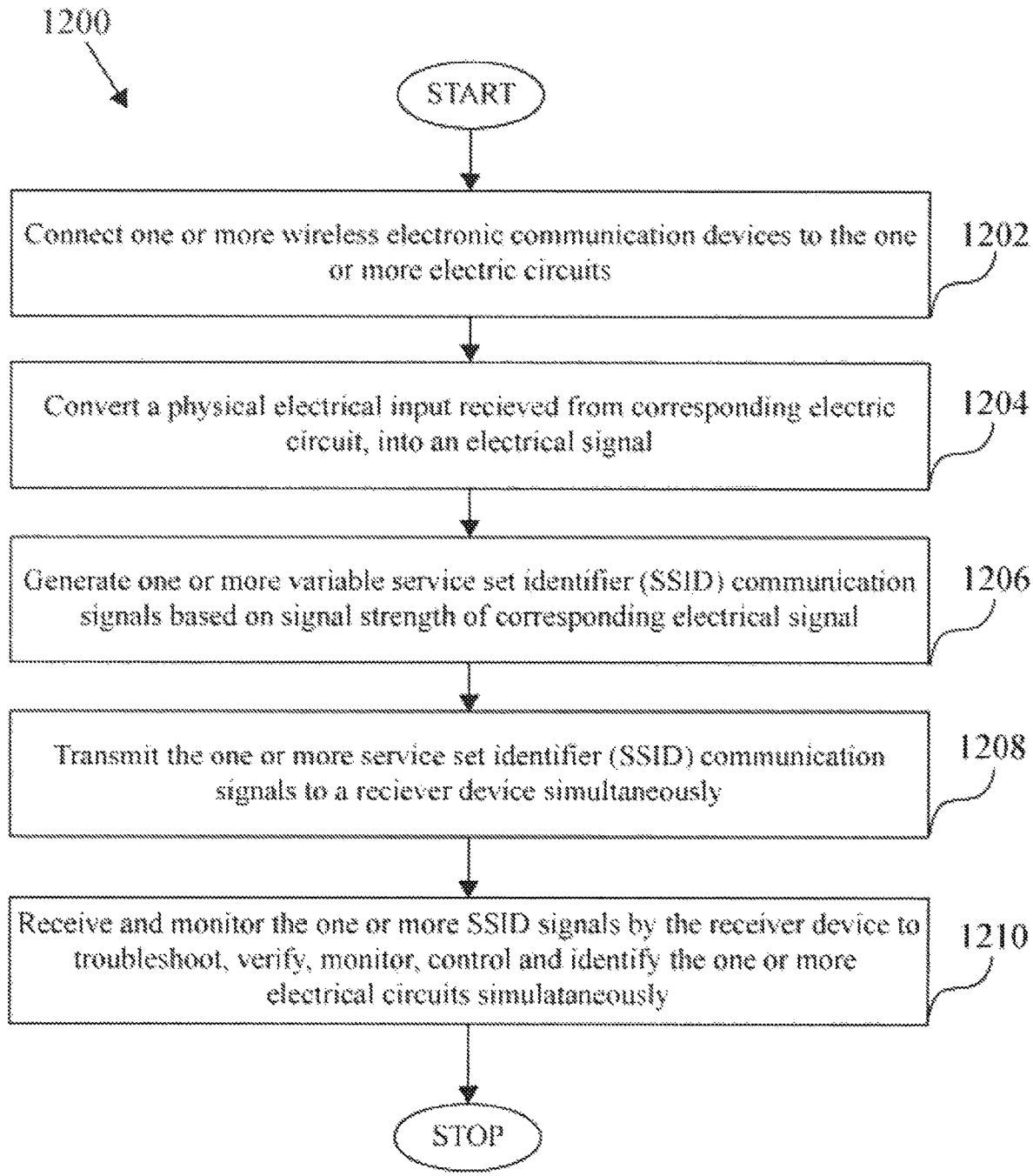
FIG. 12 is a flowchart illustrating a method for troubleshooting an electric circuit using a wireless testing device, in accordance with an embodiment of the present invention.

FIG. 12 is a flowchart illustrating a method 1200 for troubleshooting an electric circuit using a wireless testing device, in accordance with an embodiment of the present invention.

At step 1202, one or more wireless testing devices are connected to the one or more electric circuits. A wireless testing device may be connected to corresponding electric circuit through at least one of: a socket adapter, an alligator clip adapter and a current transformer.

At step 1204, a physical electrical input received from corresponding electric circuit is converted into an electrical signal. The physical electrical input may be selected from standard electrical parameters consisting of: voltage, current, resistance, conductance, capacitance, charge, inductance, power, impedance and frequency. The condition of an electrical circuit can be used as the physical input, for examples, reversed polarity (reversed hot/neutral, reversed hot/ground, reversed ground/neutral), short circuit, open ground, open neutral, or open hot.

At step 1206, one or more variable service set identifier (SSID) communication signals are generated based on input electrical signal. The one or more SSID communication signals may be customizable to add additional information to a payload prior to transmission using a section in the 32-character SSID network name. Further, the one or more SSID communication signals may be customizable by broadcast range to save power, modulate signal, and mitigate signal interference. Furthermore, the one or more SSID communication signals may be customizable based on one or more frequency bands with a selected ability to channel hop through non-overlapping channels according to one of the IEEE 802.11 family of protocols.

At step 1208, the one or more service set identifier (SSID) communication signals are transmitted to a receiver device simultaneously, wherein the receiver device is communicatively coupled to the one or more wireless communication devices through wireless connection. The wireless testing device may be connected to the receiver device through at least one of: Radio Communication. Bluetooth, WIFI, gateway communication, and a dedicated physical cable connection for trusted software updates At step 1210, the one or more SSID signals are received and monitored by the receiver device to troubleshoot, verify, analyze, monitor, control and identify the one or more electrical circuits simultaneously. The receiver device may include an image capturing device to capture and store an image of a breaker panel corresponding to one or more electrical circuits, wherein the breaker panel and the corresponding one or more electrical circuits are labeled with custom encoded stickers. The custom encoded stickers are encoded using at least one of: color, symbol, boarder, shape, nomenclature, logogram, character, texture and size. The receiver device may further include an Artificial Intelligence (AI) based image recognition module for analyzing the image of the breaker panel to identify a layout of the breaker panel and a current rating of each circuit breaker of the breaker panel, and forming a digital panel card for the purpose of electrical troubleshooting in real-time. The receiver device may furthermore include an Augmented Reality (AR) module for enabling the user to navigate through image of the breaker panel, and enable the user to troubleshoot corresponding breaker panel.

In various embodiments, the wireless testing device is configured to support one-way transmission of the one or more service set identifier (SSID) communication signals. After generating, the one or more service set identifier (SSID) communication signals are transmitted simultaneously to a receiver device. The command output is then included in the one or more SSID communication signals and based on the received SSID communication signals, the receiver device performs the desired tasks.

The present invention can command devices through SSID communication signals. After the command has been completed, it is necessary for the device to notify the user that this command was accepted, performed and the new operation status of the device. Further yet in another embodiment of the invention, for added secure operations, the device has the ability to request a pass key. Pass keys and tokens are established at first setup and are for one-time use. These combination sets are random in their relation to each other. When a token is sent out by the receiver device, an associated pass key to that token that is stored in the memory unit of the device, is transmitted. This confirms to the command receiver device that the command issuing device is legitimate. This is the security of the device and since every pass key & token combination is different from any previously used and random in its nature therefore, it is impossible to back.

The present invention may be implemented in the form of a computer programmable product for generating and communicating one or more SSID communication signals to receiver devices. The computer programmable product includes a set of instructions, the set of instructions when executed by a processor causes the processor to perform the methods as discussed with FIG. 12.

Figure 13:
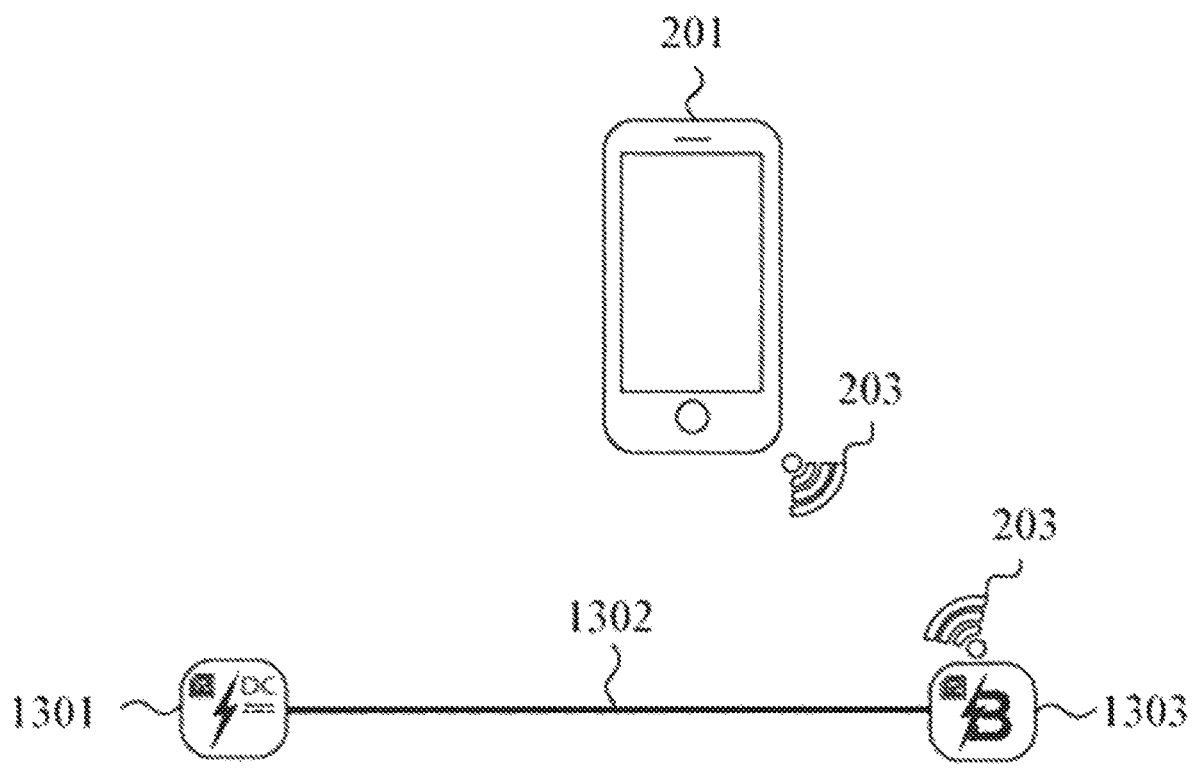
FIG. 13 illustrates an exemplary system for performing electrical troubleshooting of a data communication line, in accordance with an embodiment of the present invention.

FIG. 13 illustrates an exemplary system for troubleshooting data communication lines. The portable supply 1301 supplies direct current power on the data communication line 1302, the data line testing device 1303 receives input and provides a wireless communication signal 203 of the IEEE 802.11 or 802.15 family of protocols communication signals to be received and monitored by the smart device's 201 software application.

The portable supply 1301 may supply any form of energy to the line, for example Alternating Current (AC) or Direct Current (DC). In some variations, the data line testing device 1303 will host its own battery, and portable supply 1301 may supply light for optical testing and the data communication line 1302 may be a fiber optic line.

Figure 14:
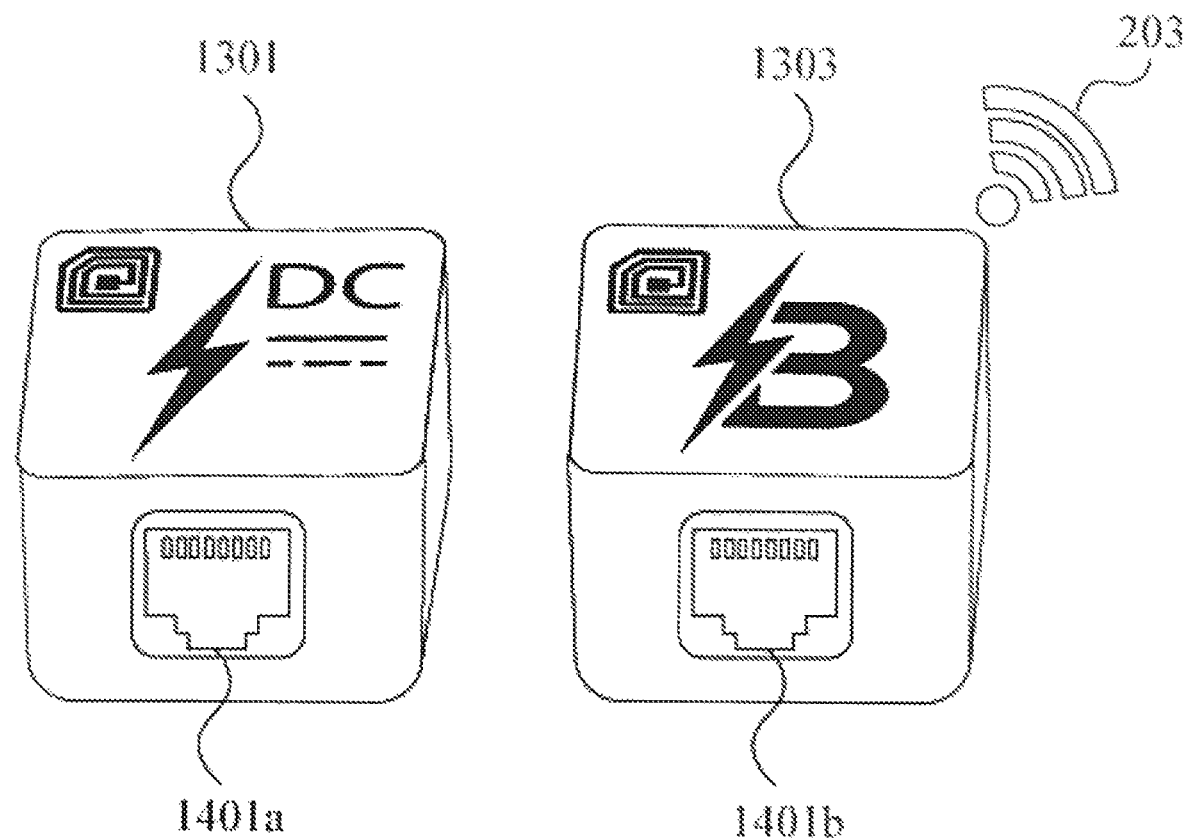
FIG. 14 illustrates the input ports of a wireless testing device and a portable supply device, for performing electrical troubleshooting of a data communication line, in accordance with an embodiment of the present invention.

FIG. 14 illustrates exemplary input ports 1401a and 1401b of the portable supply 1301 and the data line testing device 1303.

Further, the input ports 1401a and 1401b may be any type of data port for example: Optical, PS/2, Serial port, Parallel Port, Centronics Port, Audio Port, S/PDIF/TOSLINK, Video Port, Digital Video Interface (DVI), Display Port, RCA Connector, Component Video, S-Video, HDMI, USB, RJ-45, RJ-11, e-SATA or any other lesser known computer ports.

The present invention may be implemented for any environment having multiple devices. Various environments are discussed in FIG. 1 but the invention may be implemented for other environments although not mentioned.

The wireless communication device as described in the present invention or any of its components, may be embodied in the form of a computer system. Typical examples of a computer system include a general-purpose computer, a programmed microprocessor, a micro-controller, a peripheral integrated circuit element, and other devices or arrangements of devices that are capable of Implementing the method of the present invention.

The computer system comprises a computer, an input device, a display unit and the Internet. The computer further comprises a microprocessor. The microprocessor is connected to a communication bus. The computer also includes a memory. The memory may include Random Access Memory (RAM) and Read Only Memory (ROM). The computer system further comprises a storage device. The storage device can be a hard disk drive or a removable storage drive such as a floppy disk drive, optical disk drive, etc. The storage device can also be other similar means for loading computer programs or other instructions into the computer system. The computer system also includes a communication unit. The communication unit communication unit allows the computer to connect to other databases and the Internet through an I/O interface. The communication unit allows the transfer as well as reception of data from other databases. The communication unit may include a modem, an Ethernet card, or any similar device which enables the computer system to connect to databases and networks such as LAN, MAN, WAN and the Internet. The computer system facilitates inputs from a user through input device, accessible to the system through I/O interface.

The computer system executes a set of instructions that are stored in one or more storage elements, in order to process input data. The storage elements may also hold data or other information as desired. The storage element may be in the form of an information source or a physical memory element present in the processing machine.

The set of instructions may include one or more commands that instruct the processing machine to perform specific tasks that constitute the method of the present invention. The set of instructions may be in the form of a software program. Further, the software may be in the form of a collection of separate programs, a program module with a larger program or a portion of a program module, as in the present invention. The software may also include modular programming in the form of object-oriented programming. The processing of input data by the processing machine may be in response to user commands, results of previous processing or a request made by another processing machine.

For a person skilled in the art, it is understood that these are exemplary case scenarios and exemplary snapshots discussed for understanding purposes, however, many variations to these can be implemented in order to detect objects (primarily human bodies) in video/image frames.

In the drawings and specification, there have been disclosed exemplary embodiments of the present invention. Although specific terms are employed, they are used in a generic and descriptive sense only and not for purposes of limitation, the scope of the present invention being defined by the following claims. Those skilled in the art will recognize that the present invention admits of a number of modifications, within the spirit and scope of the inventive concepts, and that it may be applied in numerous applications, only some of which have been described herein. It is intended by the following claims to claim all such modifications and variations which fall within the true scope of the present invention.

What is claimed is:

1. A system for testing one or more electrical circuits simultaneously, the system comprising:
   a. one or more wireless testing devices for analyzing one or more electric circuits through electrical instrumentation, wherein each wireless testing device comprises:
   b. an input unit connected to a generator unit, the input unit configured to convert a realtime external input from a human, or physical environment or physical electrical input received from the corresponding one or more electrical circuits, into an electrical signal;
   c. a generator unit configured to repeatedly generate one or more service set identifier (SSID) communication signals containing an amount of time that has elapsed since the one or more wireless testing device's activation and then receive the electrical signal and customize one or more variable service set identifier (SSID) communication signals dynamically according to the electrical signal; and
   d. a transmitter unit comprising one or more transmitters, wherein the one or more transmitters are configured to transmit the one or more SSID communication signals to a one or more receiver devices simultaneously;
   wherein the receiver devices are configured to receive and monitor the one or more SSID signals, to troubleshoot, verify, analyze, monitor, control and identify the one or more electrical circuits simultaneously.

2. The system as claimed in claim 1, wherein the physical electrical input is selected from standard electrical parameters consisting of: voltage, current, resistance, conductance, capacitance, charge, inductance, power, impedance and frequency, and wherein the physical electrical input is selected from conditions of an electrical circuit consisting of:
reversed polarity, reversed hot/neutral, reversed hot/ground, reversed ground/neutral, short circuit, open ground, open neutral, and open hot.

3. The system as claimed in claim 1, wherein the transmitter unit is a Wi-Fi transmitter configured to transmit Wi-Fi SSID signals based on the IEEE 802.11 and 802.15 family of protocols and associated frequencies simultaneously.

4. The system as claimed in claim 1, wherein the one or more SSID communication signals are customizable to add additional information to a payload prior to transmission using a section in the 32-character SSID network name.

5. The system as claimed in claim 1, wherein the one or more SSID communication signals are customizable by broadcast range to save power, modulate signal, and mitigate signal interference.

6. The system as claimed in claim 5, wherein the one or more SSID communication signals are customizable based on one or more frequency bands with a selected ability to channel hop through non-overlapping channels according to one of the IEEE 802.11 or 802.15 family of protocols.

7. The system as claimed in claim 1, wherein the wireless testing device further comprises a memory unit configured to store one or more of the following: a unique Media access Control (MAC) address, indoor positioning system (IPS) location co-ordinates, Global positioning system (GPS) location co-ordinates, electrical information about corresponding electrical circuit, and one or more SSIDs communication signals received.

8. The system as claimed in claim 1 further comprising a gateway device communicatively coupled between the wireless testing device and the receiver device, wherein the gateway device is configured to convert a received SSID beacon frame in one frequency/protocol and transmit the same signal payload in a different frequency/protocol according to one of the IEEE 802.11 family of protocols.

9. The system as claimed in claim 1, wherein the wireless testing device is connected to the receiver device through at least one of: Radio Communication, Bluetooth, WIFI, gateway communication, and a dedicated physical cable connection.

10. The system as claimed in claim 1, wherein the wireless testing device is connected to the corresponding electric circuit through an input adapter of at least one of: a connector, a socket adapter, an alligator clip adapter, a current transformer, a sensor, a non-contact voltage detector and electrical measuring instrumentation.

11. The system of claim 1, wherein the wireless testing device is a non-contact voltage detector used to monitor the line safely at a switch or feed via wand or clamp.

12. The system of claim 1, wherein the receiving device can use a labelling system to identify electrical outlets, devices, appliances, and equipment that enables the stored digital electrical information of the labelled item to be quickly retrieved for the purposes of viewing and/or editing this detailed information.

13. The system of claim 12, wherein the label uses a character encoded Sticker, QR code, radio frequency identification (RFID) and near field communication (NFC) chip for the user to manually collect the information directly from the physical label.

14. The system of claim 1, wherein the generator unit configured to receive the electrical signal may also generate a timestamp of an event relating to the electrical input signal.

15. The system of claim 14, wherein the timestamp may be transmitted and used to identify power or communication lines from arbitrarily large distances.

16. The system of claim 1, wherein the data collected by the system is used to automate the generation of one or more equipment labels, digital/physical circuit directories, one-line diagrams, electrical safety reports, electrical documents, or interactive floorplans.

17. The system as claimed in claim 10, wherein the current transformer, hall effect sensor, or non-contact voltage detector is used to monitor current pulled by an existing load or a wireless testing device load to identify/trace a line without disrupting power.

18. A system for testing one or more electrical circuits simultaneously, the system comprising:
a. one or more wireless testing devices for analyzing one or more electric circuits through electrical instrumentation, wherein each wireless testing device comprises:
b. an input unit connected to a generator unit, the input unit configured to convert a realtime external input from a human, or physical environment or physical electrical input received from the corresponding one or more electrical circuits, into an electrical signal;
c. a generator unit configured to repeatedly generate one or more service set identifier (SSID) communication signals containing the amount of time that has elapsed since the one or more wireless testing device's activation and then to receive the electrical signal and customize one or more variable service set identifier (SSID) communication signals dynamically according to the electrical signal;
d. a transmitter unit comprising one or more transmitters, wherein the one or more transmitters are configured to transmit the one or more SSID communication signals to one or more receiver devices simultaneously;
wherein the receiver devices are configured to receive and monitor the one or more SSID signals, to troubleshoot, verify, analyze, monitor, control and identify the one or more electrical circuits simultaneously; and
wherein the receiver device comprises:
an image capturing device to capture and store an image of a breaker panel corresponding to one or more electrical circuits, wherein the breaker panel and the corresponding one or more electrical circuits are selectively labeled or labeled with custom encoded stickers;
an Artificial Intelligence (AI) based image recognition module for analyzing the image of the breaker panel to identify a layout of the breaker panel and a current rating of each circuit breaker of the breaker panel, and forming a digital panel card for the purpose of electrical troubleshooting in real-time;
an Augmented Reality (AR) module for enabling the user to navigate through image of the breaker panel, and enable the user to troubleshoot corresponding breaker panel.

19. The system as claimed in claim 18, wherein the custom encoded stickers are encoded using at least one of: color, symbol, boarder, shape, nomenclature, logogram, character, texture and size for the purpose of image recognition.

20. The system as claimed in claim 18, wherein each of the wireless electronic device, electric circuit, and the breaker panel includes at least one of: Encoded sticker, QR code, Radio frequency identification (RFID) and Near field communication (NFC) chips, to enable the user to perform verification of corresponding electric floor plan stored in the receiver device.

21. The system as claimed in claim 20 further comprising a server configured to perform timestamping and storing of existing electrical parameters of the electric floor plan captured from instrumentation/testing equipment measurement readings, pictures of equipment labels encoded labels and electrical drawings using image recognition.

22. The system as claimed in claim 21, wherein the trusted timestamping system uses blockchain technology to store data hashes on the blockchain, or one of the methods covered in the ANSI X9.95 standard.

23. A method for capturing as-built information through image/pattern recognition and linking the as-built information to equipment documentation to generate an electrical reference and guide namely digital interactive electrical floor plans, one-line diagrams and electrical schematics comprising:
   a) taking a picture of an existing electrical floor plan, one-line diagram or electrical schematic;
   b) extracting and encoding into a low resolutions format, namely extensible markup language (XML) or javascript object notation (JSON), the essential features of a document namely length and orientation of walls, location and type of receptacle, lights, wiring, appliances and equipment using image recognition methods namely to machine learning algorithms trained on image data bases of standardized electrical schematic symbols;
   c) rendering a graphic user interface (GUI) software interface that digitally recreates the electrical floor plans, one-line diagrams and electrical schematics using the encoding derived in step b);
   d) allowing a user of the GUI software interface to add or link additional data to features of the electrical floor plan, one-line diagram or electrical schematic using the GUI software interface;
   e) allowing a user of the GUI software interface to browse, select and download the additional data that has been added to the various features of the digital electrical floor plan, one-line diagram or electrical schematic for the purposes of electrical troubleshooting.

24. The method as claimed in 23, wherein the captured as-built information is extracted from pictures of equipment labels/rating plates using image recognition.

25. The method as claimed in claim 23, wherein the equipment documentation includes:
   electrical floor plans, electrical schematics, electrical one-line diagrams, user guides, white papers, method of procedure (MOP), standard operating procedures (SOP), emergency operating procedures (EOP), inventory spare part lists, original equipment manufacturer (OEM) manual, or an operations & maintenance (O&M) manual and/or panel cards, power source locations, circuit capacities, maintenance records, permits, warranties, serial numbers, model numbers, and any related data the user requires to be stored.

26. A method for power source identification, comprising:
   connecting one or more wireless testing devices to one or more electric circuits of a breaker panel, wherein the one or more wireless testing devices are configured to generate and transmit one or more service set identifier (SSID) communication signals to a receiver device simultaneously, based on input of corresponding electric circuit, and wherein the receiver device is configured to provide a user interface for power source identification of the breaker panel;
   plugging one or more wireless testing devices into power receptacle outlets of one or more electrical circuits;
   cycling power of each electrical circuit;
   monitoring and recording the wireless testing devices connected to each electric circuit, based on the corresponding SSID signals received, after the corresponding electric circuit is turned off; and
   displaying electrical circuits associated with each wireless testing device on the user interface.

27. A method for testing one or more electric circuits simultaneously, the method comprising:
   a. connecting one or more wireless testing devices to the one or more electric circuits;
   b. converting a physical electrical input received from corresponding electric circuit, into an electrical signal;
   c. generating one or more variable service set identifier (SSID) communication signals corresponding to input electrical signal;
   d. transmitting communication signals to a receiver device simultaneously, wherein the receiver device is communicatively coupled to the one or more wireless testing devices through wireless connection; and
   e. receiving and monitoring the communication signals to troubleshoot, verify, analyze, monitor, control and identify the one or more electrical circuits simultaneously.

28. A method for testing one or more electric circuits simultaneously, the method comprising:
   a. connecting one or more wireless testing devices to the one or more electric circuits;
   b. converting a physical electrical input received from corresponding electric circuit, into an electrical signal;
   c. generating one or more variable service set identifier (SSID) communication signals corresponding to input electrical signal;
   d. transmitting communication signals to a receiver device simultaneously, wherein the receiver device is communicatively coupled to the one or more wireless testing devices through wireless connection; and
   e. receiving and monitoring the communication signals to troubleshoot, verify, analyze, monitor, control and identify the one or more electrical circuits simultaneously;
   f. capturing and storing an image of a breaker panel corresponding to one or more electrical circuits at the receiver device, wherein the breaker panel and the corresponding one or more electrical circuits are labeled with custom encoded stickers;
   g. analyzing the image of the breaker panel using an Artificial Intelligence (AI) based image recognition module of the receiver device, to identify a layout of the breaker panel and a current rating of each circuit breaker of the breaker panel, and forming a digital panel card for the purpose of electrical troubleshooting in real-time; and
   h. enabling the user to navigate through an image of the breaker panel through an Augmented Reality (AR) module of the receiver device, for troubleshooting corresponding breaker panel.

29. The method as claimed in claim 28, wherein the custom encoded stickers are encoded using at least one of: color, symbol, boarder, shape, nomenclature, logogram, character, texture and size.

30. The method as claimed in claim 29, wherein the method is for utility line identification using relative event timestamps.

31. The method of claim 30, wherein:
- a software application on a smart device directs the user to connect an instrumentation device to one or more utility circuits or lines; the user is then directed to trigger an event to temporarily interrupt the utility;
- the user is then directed to confirm that the event has been completed;
- the absolute time of the event completion is logged by the software; wherein a mapping device impacted by the event also tracks the time since the event;
- the time since the event is transmitted to the smart device to deduce which line is connected to the mapping device; the payload transmitted from the mapping device to the smart device via physical wire connection, wireless connection, wireless beacon, NFC tap or global standard communication method.

32. An electronic device comprising:
- a generator unit configured to repeatedly generate one or more service set identifier (SSID) communication signals containing the amount of time that has elapsed since the electronic device's activation;
- a transmitter unit comprising one or more transmitters, wherein the one or more transmitters are configured to transmit one or more SSID communication signals to one or more receiver devices simultaneously; and
- wherein the electronic device is configured to support one way transmission of the one or more service set identifier (SSID) communication signals for the purposes of troubleshooting, verifying, analyzing, monitoring, controlling, and identifying the one or more electrical circuits simultaneously.

33. The electronic device of claim 32, wherein an input unit is connected to the generator unit and configured for converting a real-time external input from a human or physical environment into an electrical signal;
- wherein the generator circuit is configured to receive the electrical signal and customize the one or more service set identifier (SSID) communication signals dynamically according to the external input; and
- a transmitter unit comprising one or more transmitters, wherein the one or more transmitters are configured to transmit the one or more service set identifier (SSID) communication signals from the generator circuit to one or more receiving devices simultaneously;
- wherein the electronic device is configured to support one way transmission of the one or more service set identifier (SSID) communication signals for the purposes of troubleshooting, verifying, analyzing, monitoring, controlling, and identifying the one or more electrical circuits simultaneously.

34. The electronic device of claim 33, wherein the physical electrical input is selected from standard electrical parameters consisting of: voltage, current, resistance, conductance, capacitance, charge, inductance, power, impedance, and frequency, and wherein the physical electrical input is selected from conditions of an electrical circuit consisting of: reversed polarity, reversed hot/neutral, reversed hot/ground, reversed ground/neutral, short circuit, open ground, open neutral, and open hot.

* * * * *